United States Patent
Kim

(10) Patent No.: US 12,412,782 B2
(45) Date of Patent: Sep. 9, 2025

(54) SEMICONDUCTOR DEVICE AND METHOD FOR FABRICATING THE SAME

(71) Applicant: SK hynix Inc., Gyeonggi-do (KR)

(72) Inventor: Seiyon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 452 days.

(21) Appl. No.: 18/082,575

(22) Filed: Dec. 16, 2022

(65) Prior Publication Data
US 2024/0006238 A1    Jan. 4, 2024

(30) Foreign Application Priority Data

Jun. 30, 2022  (KR) .................. 10-2022-0080774

(51) Int. Cl.
| | |
|---|---|
| *H01L 21/768* | (2006.01) |
| *H01L 21/02* | (2006.01) |
| *H01L 21/302* | (2006.01) |
| *H10D 30/67* | (2025.01) |

(52) U.S. Cl.
CPC .. *H01L 21/76885* (2013.01); *H01L 21/02225* (2013.01); *H01L 21/02425* (2013.01); *H01L 21/302* (2013.01); *H01L 21/7688* (2013.01); *H10D 30/6728* (2025.01)

(58) Field of Classification Search
CPC .... H10B 12/30; H10B 12/0335; H10B 12/05; H10B 12/09; H10B 12/48; H10B 12/50; H10D 30/6728; H01L 21/76885; H01L 21/0225; H01L 21/302
See application file for complete search history.

(56) References Cited

U.S. PATENT DOCUMENTS

| | | | | |
|---|---|---|---|---|
| 2020/0194431 | A1* | 6/2020 | Castro | H10D 64/01 |
| 2020/0327935 | A1* | 10/2020 | Kim | H10N 70/8836 |
| 2022/0059694 | A1* | 2/2022 | Luo | H10B 12/315 |
| 2022/0139920 | A1* | 5/2022 | Lee | H10B 12/033 |
| | | | | 438/241 |
| 2023/0133520 | A1* | 5/2023 | Zhao | H10B 12/488 |
| | | | | 257/295 |
| 2023/0200053 | A1* | 6/2023 | Kim | H10B 12/50 |
| | | | | 257/296 |
| 2023/0309289 | A1* | 9/2023 | Choi | H10B 80/00 |

FOREIGN PATENT DOCUMENTS

KR    10-2010-0113734 A    10/2010

* cited by examiner

*Primary Examiner* — Alexander G Ghyka
(74) *Attorney, Agent, or Firm* — IP & T GROUP LLP

(57) ABSTRACT

A semiconductor device may include a substrate; a plurality of semiconductor pillars disposed over the substrate and arranged in a first direction and a second direction crossing the first direction; an insulating layer pattern disposed between the substrate and the semiconductor pillars and extending in the second direction; a first conductive line disposed between the insulating layer pattern and the semiconductor pillars and extending in the second direction; a second conductive line formed over sidewalls of the semiconductor pillars and extending in the first direction; and a storage node disposed over each of the semiconductor pillars.

14 Claims, 33 Drawing Sheets

//]: #

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2022-0080774 filed on Jun. 30, 2022, which is incorporated herein by reference in its entirety.

BACKGROUND

1. Technical Field

This patent document relates generally to semiconductor technology and, more particularly, to a semiconductor device including a transistor and a method for fabricating the same.

2. Related Art

Continuous development of the electronic industry requires electronic products which are gradually more miniaturized, have higher performance, are more highly integrated, and operate at higher speed. To satisfy this requirement, it is necessary to develop technologies capable of maintaining and/or improving the characteristics of the various unit elements of the semiconductor devices such as the transistors while reducing the size or footprint of the elements.

SUMMARY

In an embodiment, a semiconductor device may include: a substrate; a plurality of semiconductor pillars disposed over the substrate and arranged in a first direction and a second direction crossing the first direction; an insulating layer pattern disposed between the substrate and the semiconductor pillars and extending in the second direction; a first conductive line disposed between the insulating layer pattern and the semiconductor pillars and extending in the second direction; a second conductive line formed over sidewalls of the semiconductor pillars and extending in the first direction; and a storage node disposed over each of the semiconductor pillars.

In another embodiment, a method for fabricating semiconductor device, may include: forming a plurality of stacked structures extending in a second direction over a substrate, each of the stacked structures including a sacrificial layer and a semiconductor layer disposed over the sacrificial layer; forming a plurality of semiconductor pillars arranged in the second direction and a first direction crossing the second direction by selectively etching the semiconductor layer; forming a first groove by removing the sacrificial layer; forming an insulating layer pattern filling a bottom portion of the first groove; forming a first conductive line filling a remaining space of the first groove in which the insulating layer pattern is formed; forming a second conductive line extending in the first direction over sidewalls of the semiconductor pillars; and forming a storage node over each of the semiconductor pillars.

These and other features and advantages of the present invention will become apparent to the skilled person in this art from the following figures and detailed description.

DETAILED DESCRIPTION

Figure 1A:
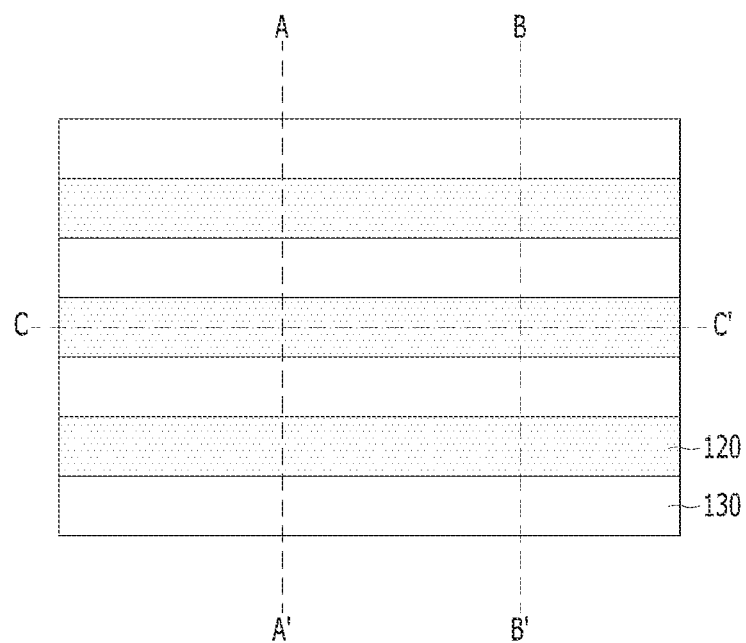
FIGS. 1A to 14B are schematic diagrams illustrating a semiconductor device according to an embodiment of the present disclosure, and a method for fabricating the same.
Figure 1B:
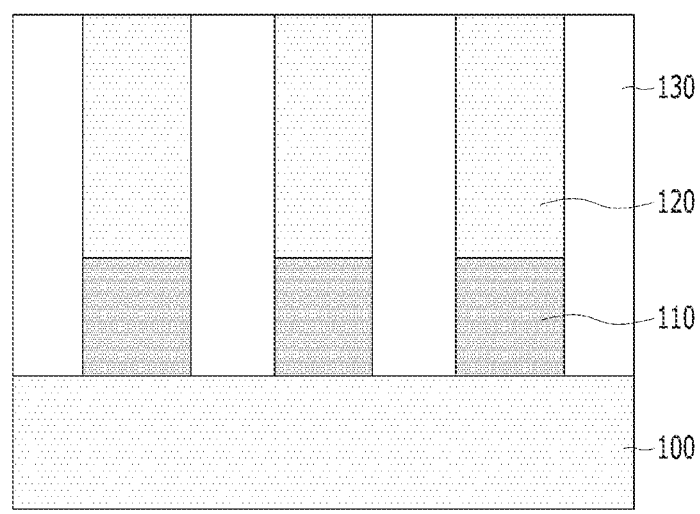
Figure 1C:
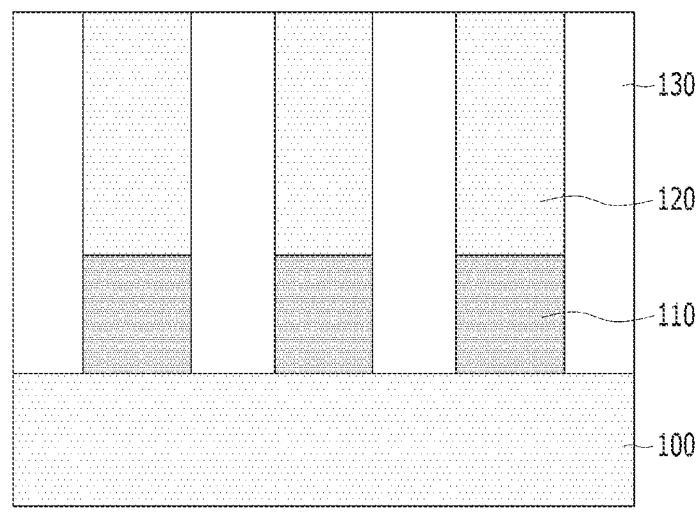
Figure 1D:
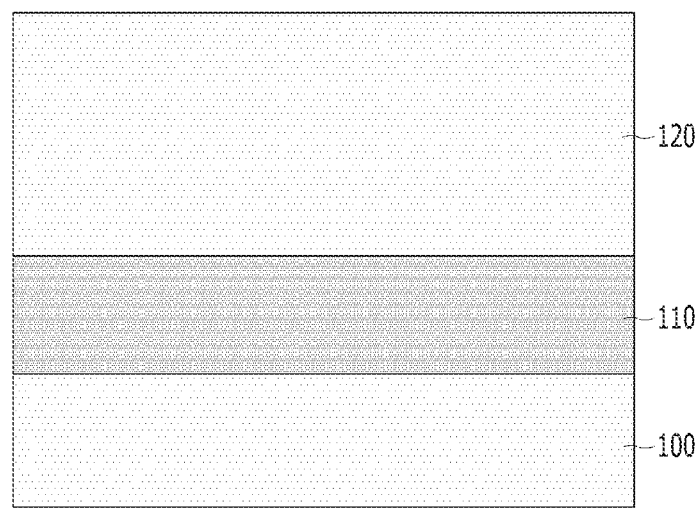
Figure 2A:
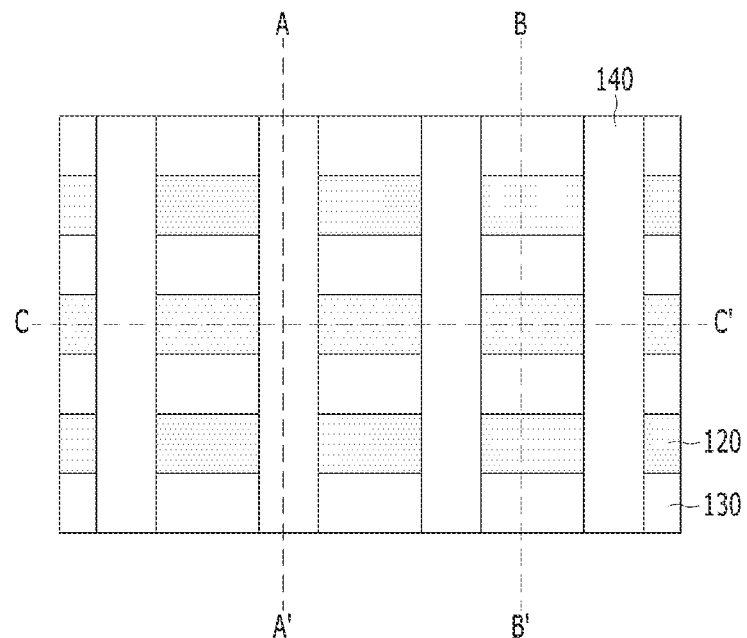
Figure 2B:
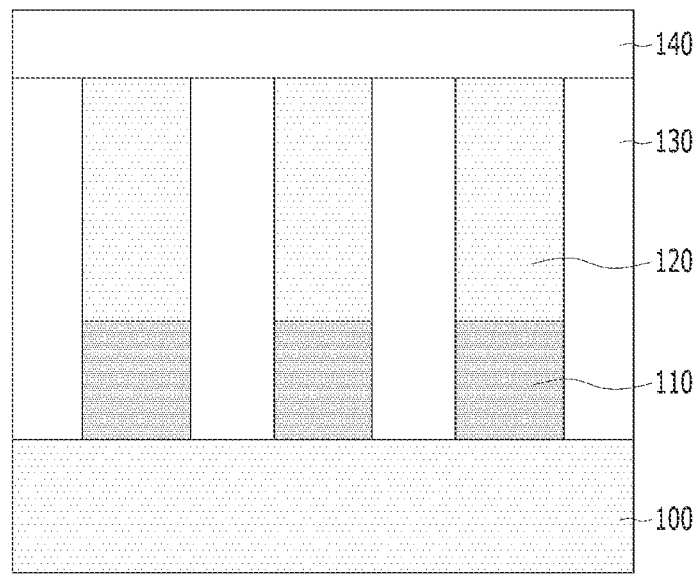
Figure 2C:
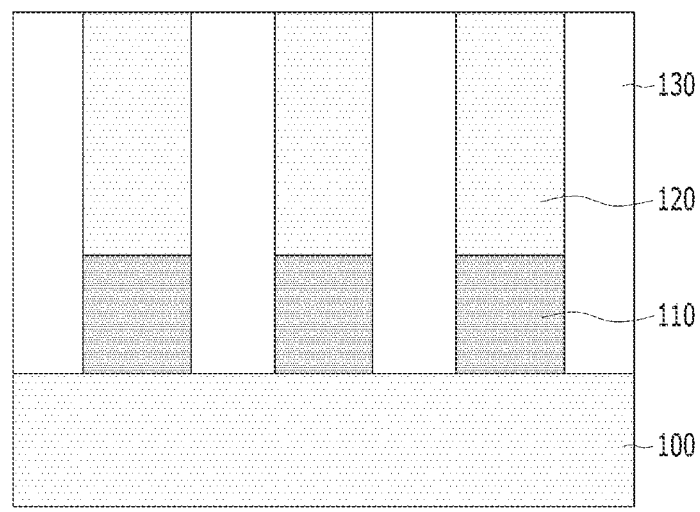
Figure 2D:
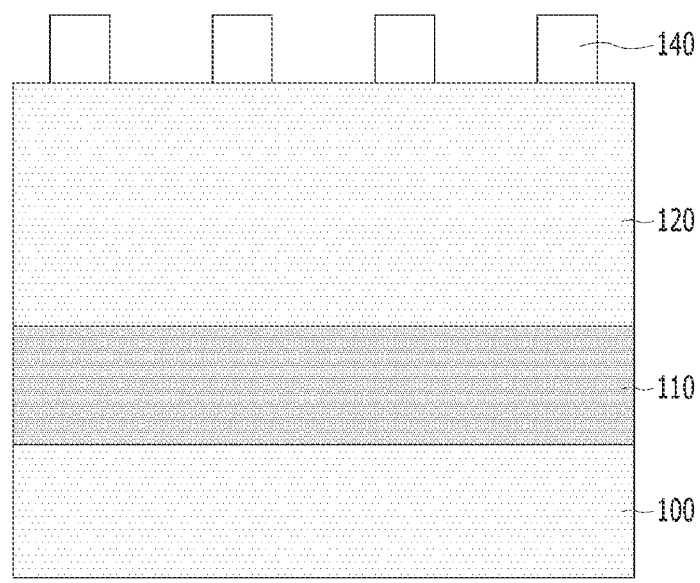
Figure 3A:
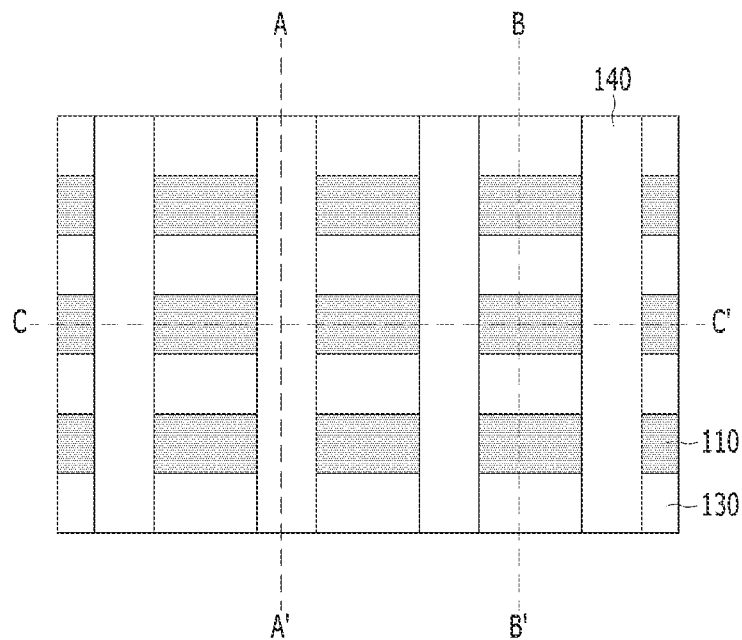
Figure 3B:
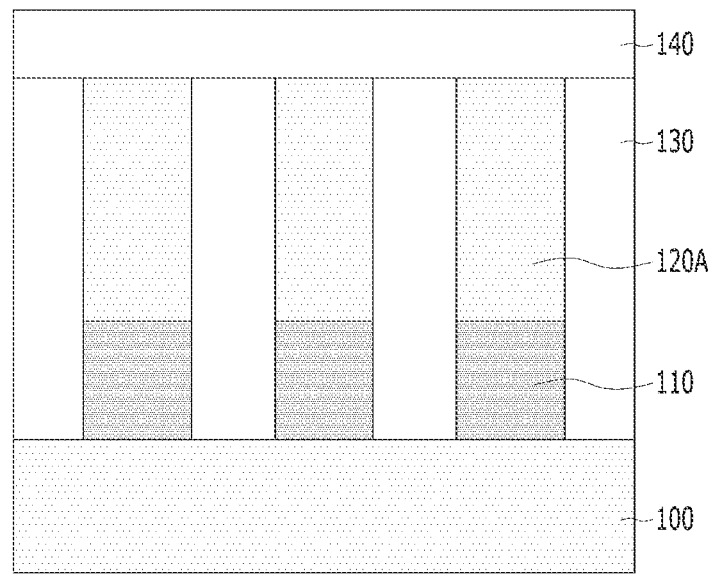
Figure 3C:
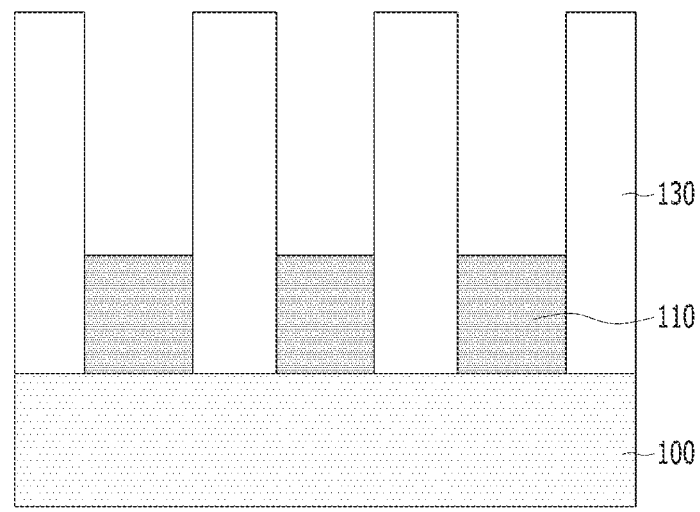
Figure 3D:
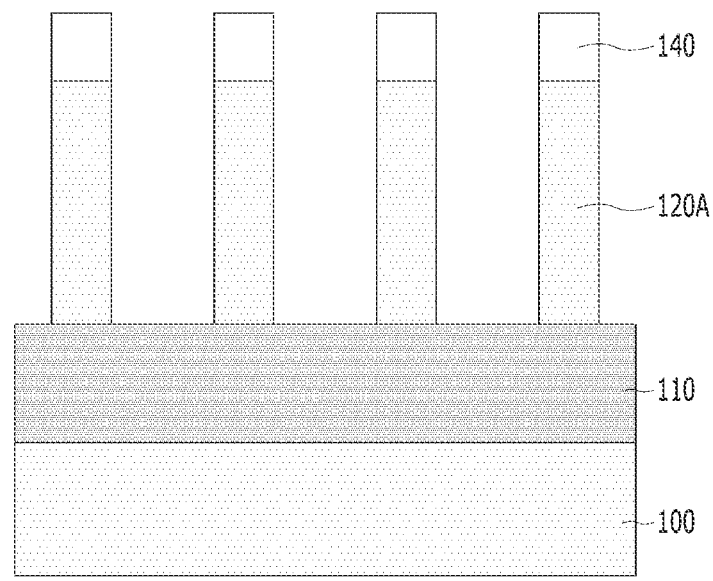
Figure 4A:
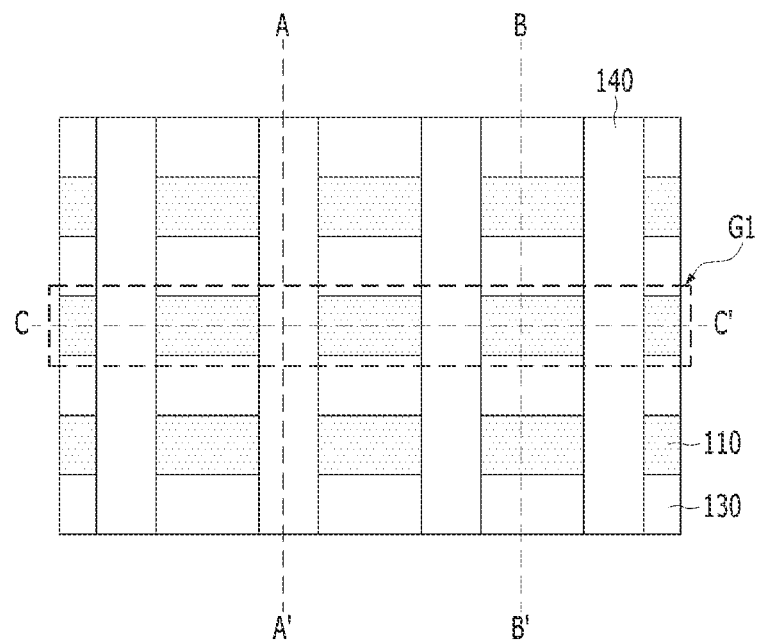
Figure 4B:
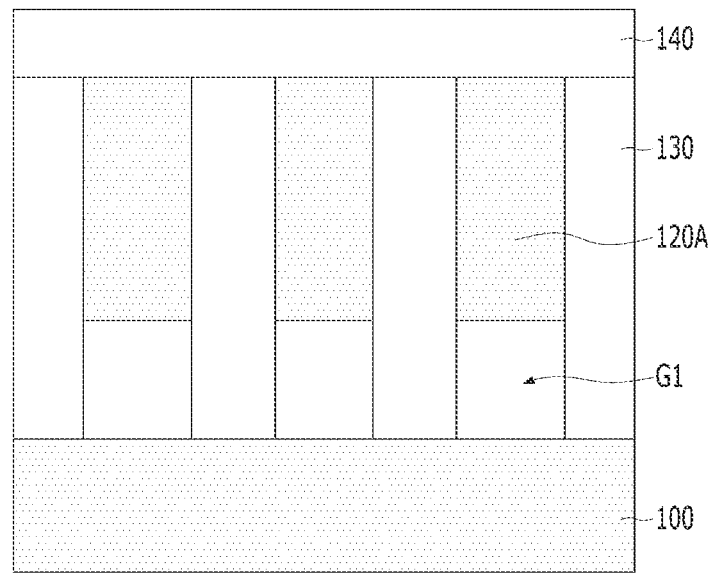
Figure 4C:
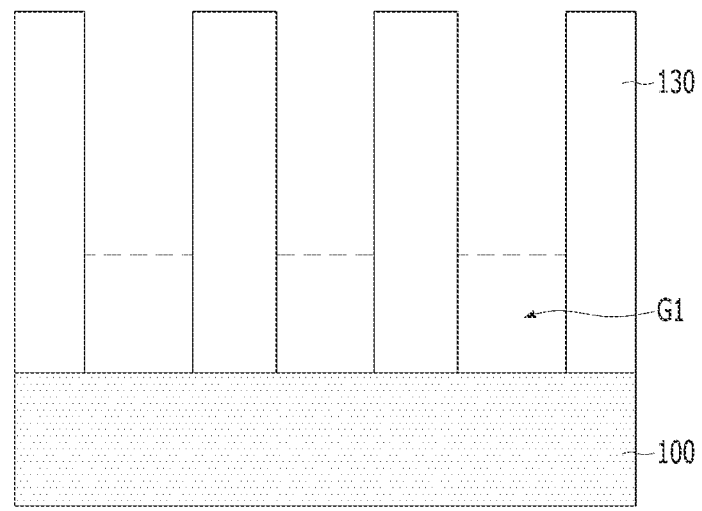
Figure 4D:
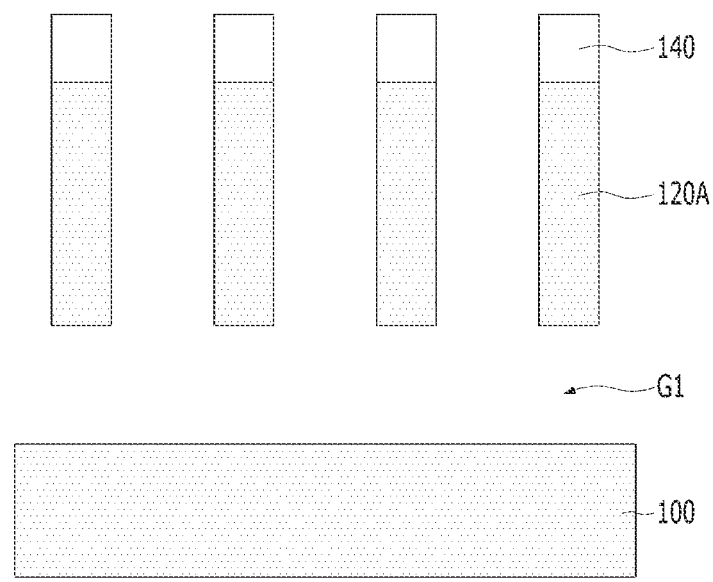

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A to 14B are schematic diagrams illustrating a semiconductor device according to an embodiment of the present disclosure, and a method for fabricating the same. FIGS. 1A, 2A, 3A, 4A, 5A, 6A, 7A, 8A, 9A, 10A, 11A, 12A, 13A, and 14A are plan schematic diagrams from above. FIGS. 1B, 2B, 3B, 4B, 5B, 6B, 7B, 8B, 9B, 10B, 11B and 12B are cross-sectional schematic diagrams taken along lines A-A' of FIGS. 1A, 2A, 3A, 4A, 5A, 6A, 7A, 8A, 9A, 10A, 11A, and 12A, respectively. FIGS. 1C, 2C, 3C, 4C, 5C, 6C, 7C, 8C, 9C, 10C, 11C, 12C, 13C, and 14C are cross-sectional schematic diagrams taken along lines B-B' of FIGS. 1A, 2A, 3A, 4A, 5A, 6A, 7A, 8A, 9A, 10A, 11A, 12A, 13A, and 14A, respectively. FIGS. 1D, 2D, 3D, 4D, 5D, 6D, 7D, 8D, 9D, 10D, 11D, 12D, 13D, and 14D are cross-sectional schematic diagrams taken along lines C-C' of FIGS. 1A, 2A, 3A, 4A, 5A, 6A, 7A, 8A, 9A, 10A, 11A, 12A, 13A, and 14A, respectively. FIGS. 13B and 14B are cross-sectional schematic diagrams taken along lines D-D' of FIGS. 13A and 14A, respectively.

First, a method for fabricating a semiconductor device of the present embodiment will be described.

Referring to FIGS. 1A to 1D, a stacked structure of a sacrificial layer 110 and a semiconductor layer 120 may be formed over a substrate 100.

The substrate 100 may include a semiconductor material such as, for example, silicon, and may have a plate shape in a plan view.

The stacked structure of the sacrificial layer 110 and the semiconductor layer 120 may have a line shape extending in a direction parallel to the line C-C' in a plan view. In addition, a plurality of stacked structures each including the sacrificial layer 110 and the semiconductor layer 120 may be arranged to be spaced apart from each other in a direction parallel to the line A-A' or the line B-B' in a plan view. In the following description, a direction parallel to the line A-A' or the line B-B' will be referred to as a first direction, and a direction parallel to the line C-C' will be referred to as a second direction. The first direction and the second direction may cross each other. For example, the first direction and the second direction may be perpendicular or substantially perpendicular to each other. The sacrificial layer 110 may include a material having an etch rate different from that of the substrate 100 and the semiconductor layer 120. For example, the sacrificial layer 110 may include SiGe. The semiconductor layer 120 may include a semiconductor material such as, for example, silicon, and may have a crystalline state. For example, the semiconductor layer 120 may include single crystal silicon.

The stacked structure of the sacrificial layer 110 and the semiconductor layer 120 may be formed by sequentially forming a sacrificial material for forming the sacrificial layer 110 and a semiconductor material for forming the semiconductor layer 120, over the substrate 100, and selectively etching the sacrificial material and the semiconductor material. Here, the sacrificial material for forming the sacrificial layer 110 may be formed by various deposition methods such as physical vapor deposition (PVD) and chemical vapor deposition (CVD), or epitaxial growth. In addition, the semiconductor material for forming the semiconductor layer 120 may be formed by various deposition methods such as, for example, PVD and CVD, or epitaxial growth.

Subsequently, a first insulating layer 130 filling a space between the stacked structures of the sacrificial layers 110 and the semiconductor layers 120 may be formed. The first insulating layer 130 may include various insulating materials such as, for example, silicon oxide, silicon nitride, silicon oxynitride, or a combination thereof. Furthermore, the first insulating layer 130 may be formed of a material having an etch rate different from that of the sacrificial layer 120. The first insulating layer 130 may be formed by forming an insulating material covering the substrate 100 and the stacked structures of the sacrificial layers 110 and the semiconductor layers 120 until the top surface of the semiconductor layer 120 is exposed, and performing a planarization process, for example, chemical mechanical polishing (CMP) or etch-back.

Referring to FIGS. 2A to 2D, a hard mask layer 140 may be formed over the structure of FIGS. 1A to 1D.

The hard mask layer 140 may have a line shape extending in the first direction in a plan view. A plurality of hard mask layers 140 may be arranged to be spaced apart from each other in the second direction. The hard mask layer 140 may be used for patterning the semiconductor layer 120 into a pillar shape in a subsequent process while supporting a structure positioned thereunder when the sacrificial layer 110 is removed. The hard mask layer 140 may include a material having an etch rate different from that of the semiconductor layer 120 and the sacrificial layer 110. As an example, the hard mask layer 140 may include an insulating material such as, for example, silicon oxide, silicon nitride, silicon oxynitride, amorphous carbon, or a combination thereof.

Referring to FIGS. 3A to 3D, a semiconductor pillar 120A may be formed by etching the semiconductor layer 120 using the hard mask layer 140 as an etch barrier.

The semiconductor pillar 120A may overlap with each one of the intersection regions of the sacrificial layer 110 extending in the second direction and the hard mask layer 140 extending in the first direction between the sacrificial layer 110 and the hard mask layer 140, and may have a pillar shape, for example, a quadrangular pillar shape. Both sidewalls of the semiconductor pillar 120A in the first direction may be aligned with both sidewalls of the sacrificial layer 110, and both sidewalls of the semiconductor pillar 120A in the second direction may be aligned with both sidewalls of the hard mask layer 140.

In this etching process, the first insulating layer 130 and the sacrificial layer 110 exposed by the formation of the semiconductor pillar 120A may be maintained the same or substantially the same. For example, there is no loss due to etching or any loss due to the etching may be insubstantial.

Referring to FIGS. 4A to 4D, the sacrificial layer 110 may be removed to form a groove G1 in the space that is formed from the removal of the sacrificial layer 110.

The removal of the sacrificial layer 110 may be performed by an isotropic etching method, for example, a wet etching method. When the sacrificial layer 110 is removed, the substrate 100, the semiconductor pillar 120A, the first insulating layer 130, and the hard mask layer 140, which have an etch rate different from that of the sacrificial layer 110, may be maintained the same or substantially the same. Accordingly, the first groove G1 having the same or substantially the same shape as the removed sacrificial layer 110 may be formed. For example, the first groove G1 may have a line shape extending in the second direction, and may have the same or substantially the same width and thickness as the removed sacrificial layer 110.

Referring to FIGS. 5A to 5D, the second insulating layer 150 filling the first groove G1 may be formed.

The second insulating layer 150 may include various insulating materials such as, for example, silicon oxide, silicon nitride, silicon oxynitride, or a combination thereof. Furthermore, the second insulating layer 150 may be formed of a material having an etch rate different from that of the substrate 100, the semiconductor pillar 120A, the first insulating layer 130, and the hard mask layer 140. The second insulating layer 150 may be formed by forming an insulating material to a thickness sufficient to fill the first groove G1 over the structure of FIGS. 4A to 4D, and removing the insulating material outside the first groove G1 by an etching process such as, for example, an etch-back process.

Referring to FIGS. 6A to 6D, a top portion (or upper portion) of the second insulating layer 150 may be removed to form a second insulating layer pattern 150A. In addition, a space formed by the removal of the top portion of the second insulating layer 150 may be referred to as a second groove G2. For example, the top portion of the second insulating layer 150 may be a portion of the second insulating layer 150 having a thickness smaller than that of the second insulating layer 150. The thickness of the top portion may be variously modified. For example, the top portion may be less than half or more than half of the total thickness of the second insulating layer 150. A remaining portion of the second insulating layer 150 that is not removed and remains over the substrate 100 to a predetermined thickness, may form the second insulating layer pattern 150A.

The removal of the top portion of the second insulating layer 150 may be performed, preferably, by an isotropic etching method. This etching process may be performed so that the second insulating layer pattern 150A and the semiconductor pillar 120A are completely separated by the second groove G2 under the semiconductor pillar 120A, and a portion of the second insulating layer 150 remains over the substrate 100 to a predetermined thickness. During the isotropic etching, undercut etching may start from just below the semiconductor pillar 120A and etched portions may meet each other under the semiconductor pillar 120A, and thus the second insulating layer pattern 150A described above may be formed. When the second insulating layer pattern 150A is formed, the substrate 100, the semiconductor pillar 120A, the first insulating layer 130, and the hard mask layer 140, which have an etch rate different from that of the second insulating layer pattern 150A, may be maintained the same or substantially the same. Accordingly, the second insulating layer pattern 150A and the second groove G2, which have the same or substantially the same shape as the sacrificial layer 110 in a plan view, may be formed. For example, the second insulating layer pattern 150A and the second groove G2 may have a line shape extending in the second direction, and may have the same width as the sacrificial layer 110. However, since the second insulating layer pattern 150A and the second groove G2 occupy the space from which the sacrificial layer 110 is removed, the sum of the thicknesses of the second insulating layer pattern 150A and the second groove G2 is substantially equal to the thickness of the sacrificial layer 110. Also, in these figures, the thickness of the second insulating layer pattern 150A is drawn to be the same as the thickness of the second groove G2, but the present disclosure is not limited thereto. The thickness of the second insulating layer pattern 150A may be smaller or greater than the thickness of the second groove G2.

Referring to FIGS. 7A to 7D, a first conductive layer 160 may be formed to fill the second groove G2 and fill an empty space defined by the first insulating layer 130, the semiconductor pillar 120A, and the hard mask layer 140 over the second groove G2.

The first conductive layer 160 may be formed of various conductive materials, for example, a metal such as platinum (Pt), tungsten (W), aluminum (Al), copper (Cu), tantalum (Ta), titanium (Ti), ruthenium (Ru), or molybdenum. (Mo), a compound of this metal, or an alloy of these metals. The first conductive layer 160 is formed by forming an insulating material to a thickness that covers the structure of FIG. 6A to 6D while sufficiently filling the second groove G2, and, performing a planarization process until the top surface of the hard mask layer 140 is exposed.

Referring to FIGS. 8A to 8D, a top portion of the first conductive layer 160 may be removed to form a first conductive line 160A filled in the second groove G2.

The top portion of the first conductive layer 160 may be removed by an etching process such as, for example, an etch-back process. The first conductive line 160A may have the same or substantially the same shape, width, and thickness as the second groove G2. For example, the first conductive line 160A may be disposed over the second insulating layer pattern 150A, and may overlap with the second insulating layer pattern 150A in a plan view to have the same or substantially the same shape and width as the second insulating layer pattern 150A. In the first direction, both sidewalls of the first conductive line 160A may be aligned with both sidewalls of the second insulating layer pattern 150A. The first conductive line 160A may be electrically and physically separated from the substrate 100 by the second insulating layer pattern 150A, Furthermore, a plurality of first conductive lines 160A may be arranged to be spaced apart from each other in the first direction, and may be electrically and physically separated from each other by the first insulating layer 130. The first conductive line 160A may function as a bit line electrically connected to one terminal of a transistor, for example, a drain terminal.

Figure 8A:
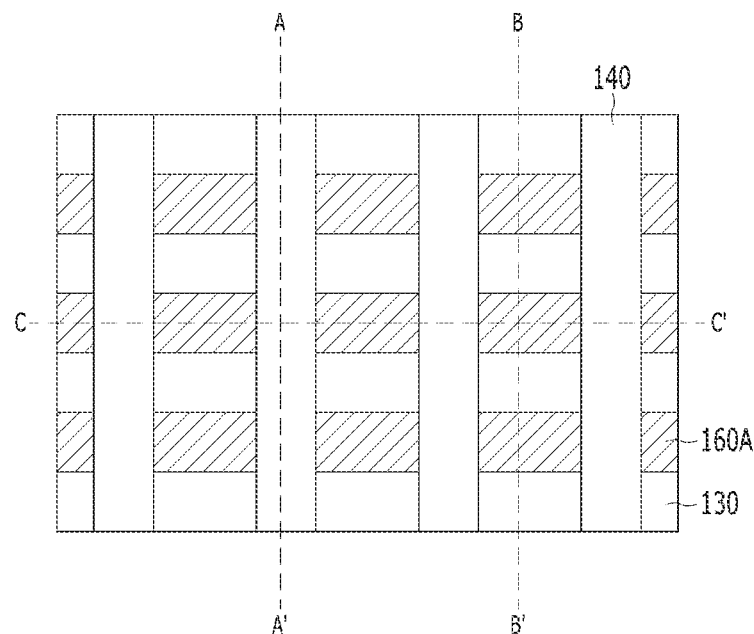
Figure 8B:
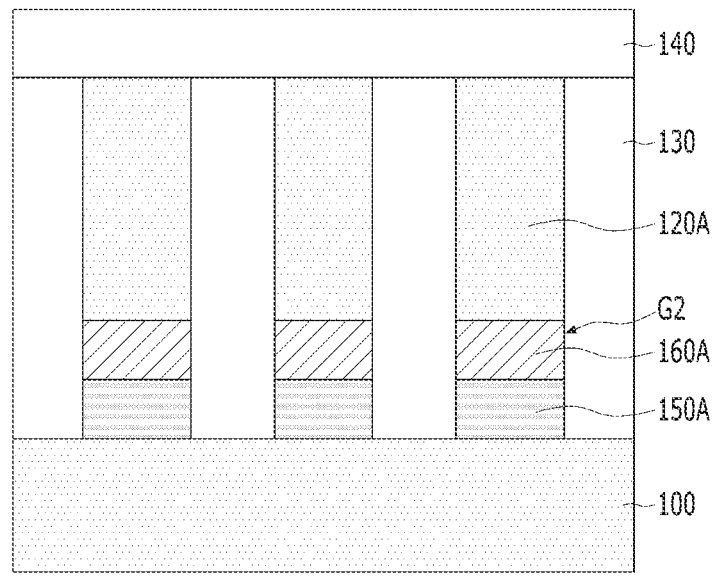
Figure 8C:
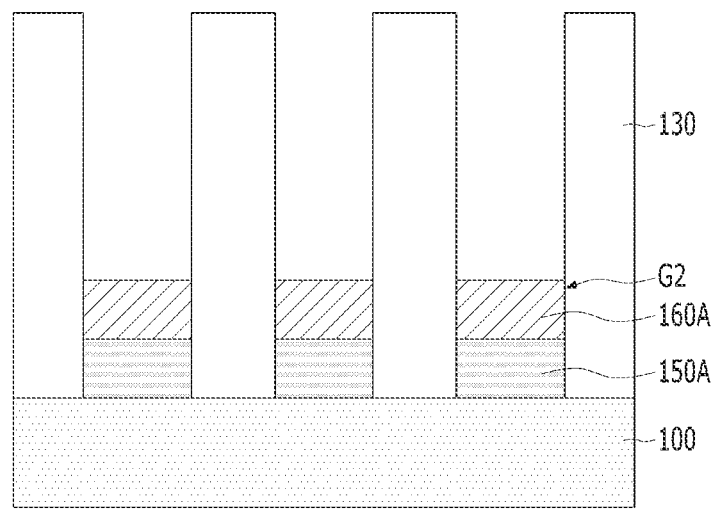
Figure 8D:
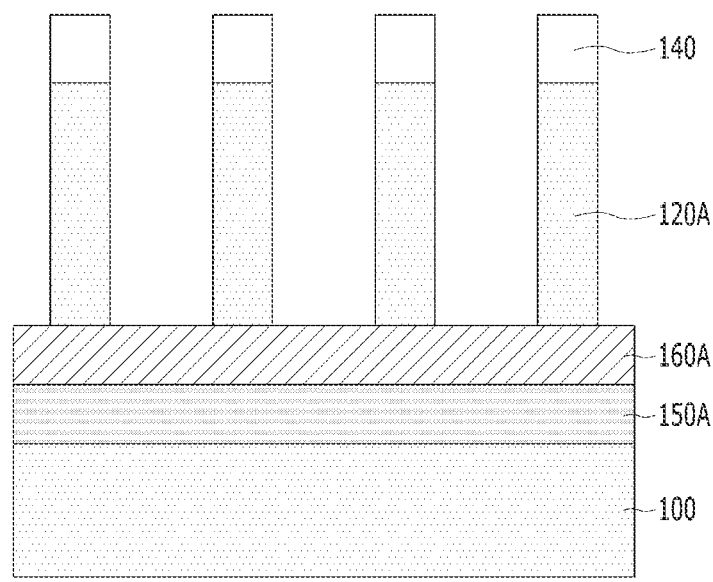
Figure 9A:
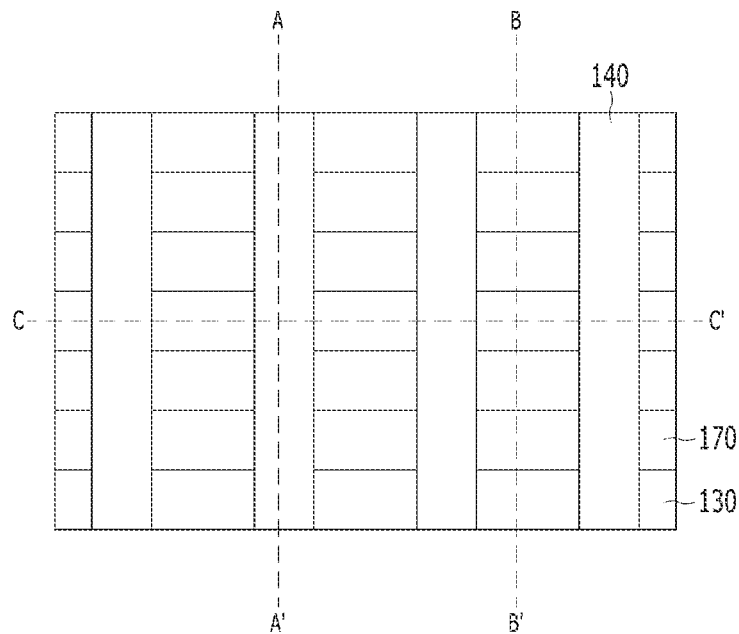
Figure 9B:
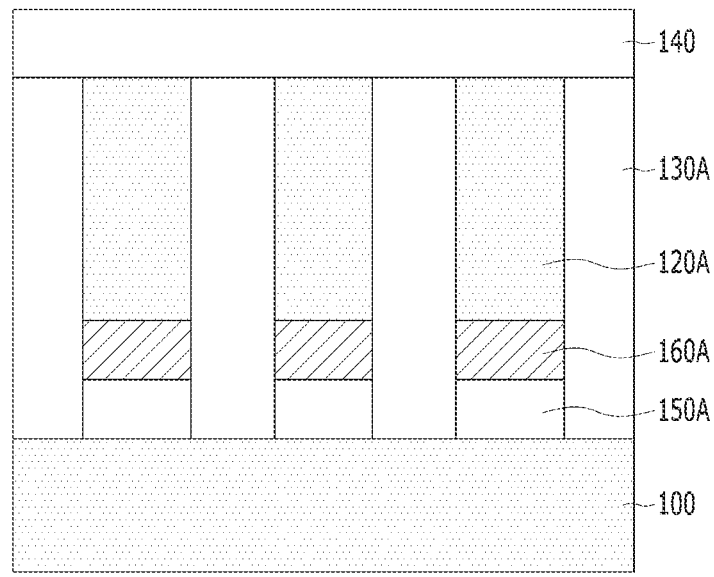
Figure 9C:
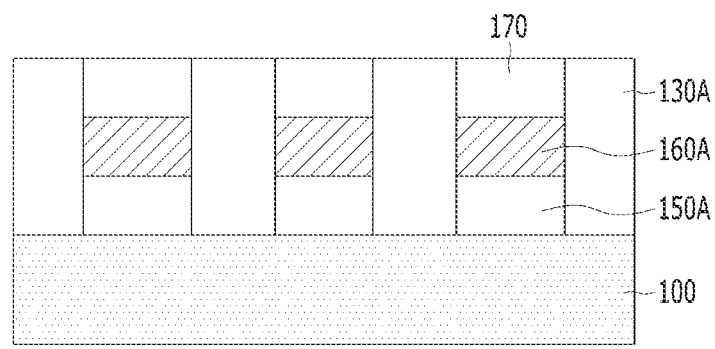
Figure 9D:
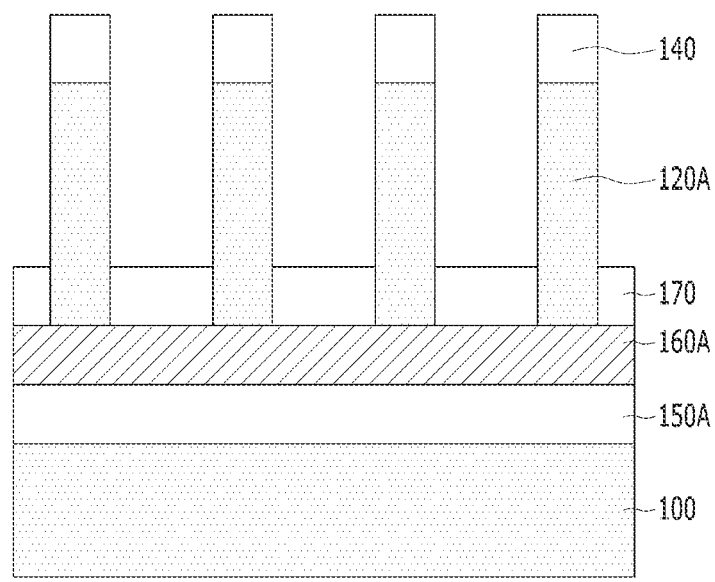
Figure 10A:
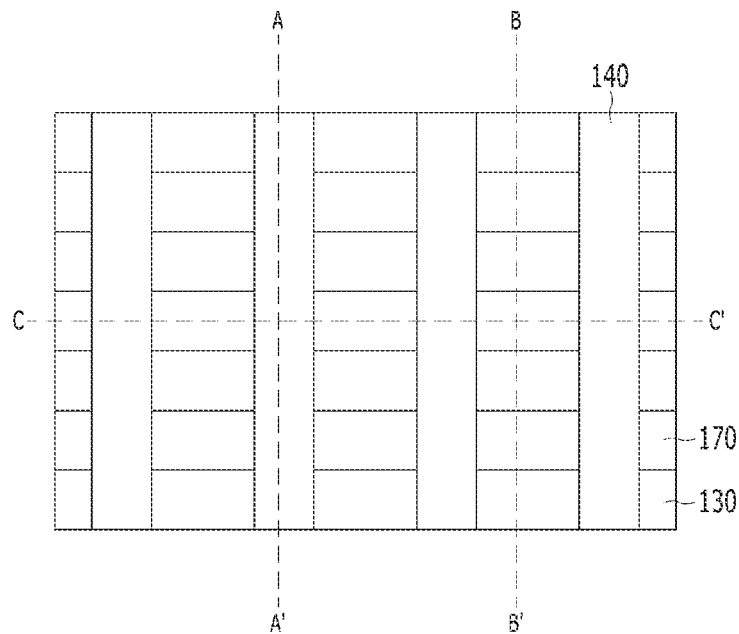
Figure 10B:
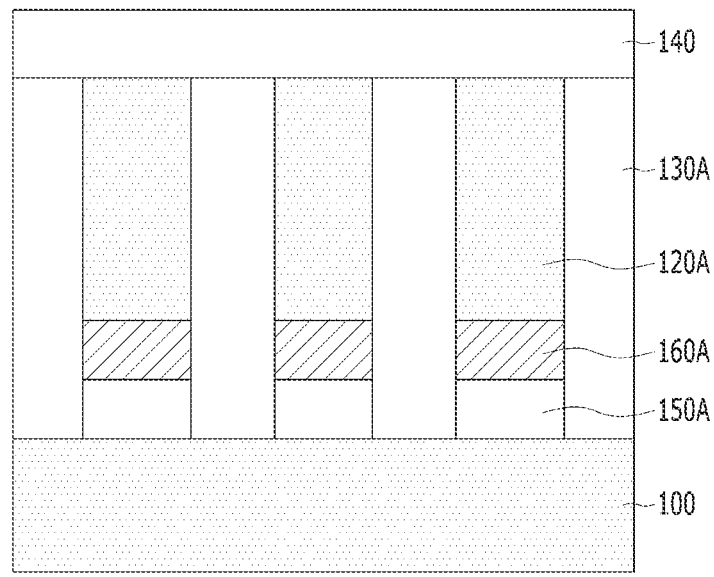
Figure 10C:
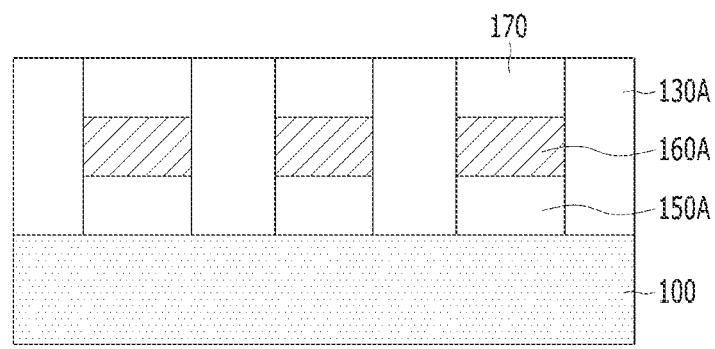
Figure 10D:
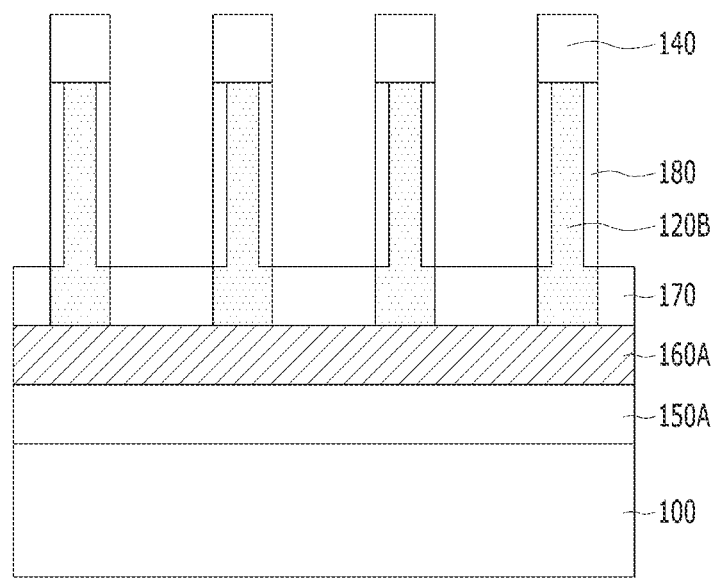
Figure 11A:
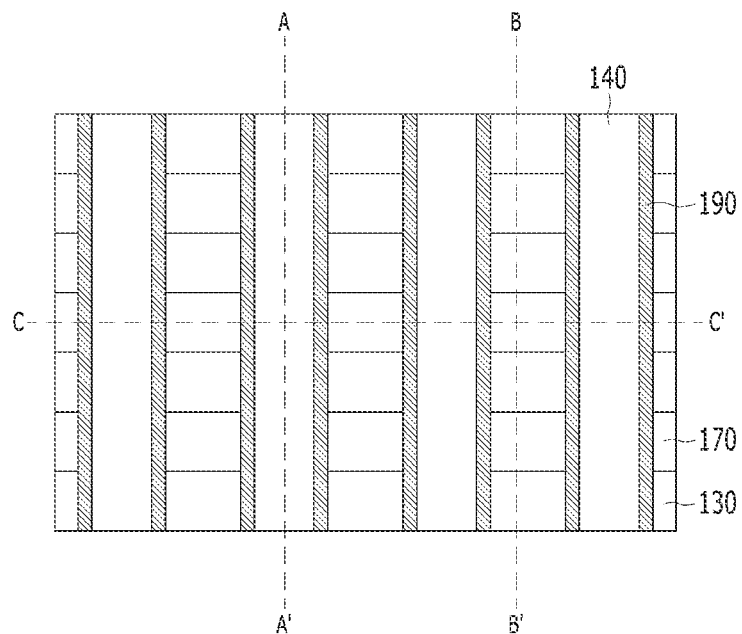
Figure 11B:
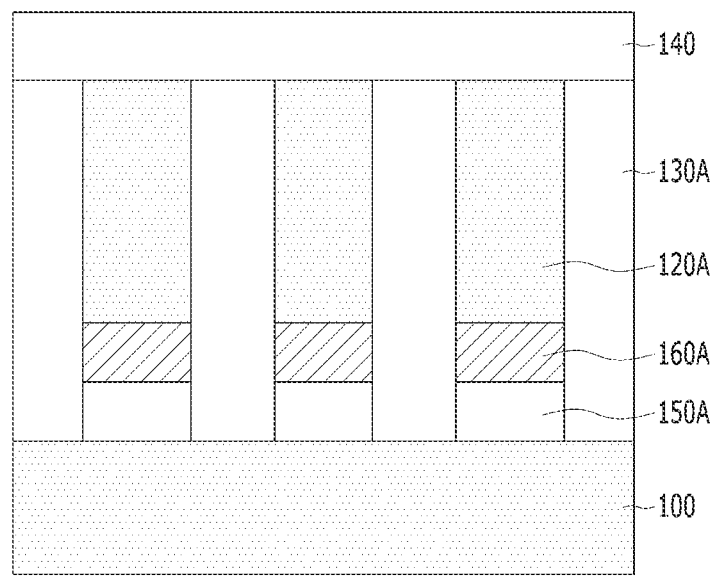
Figure 11C:
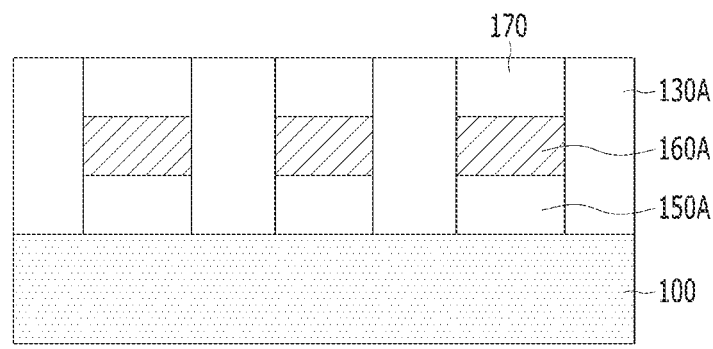
Figure 11D:
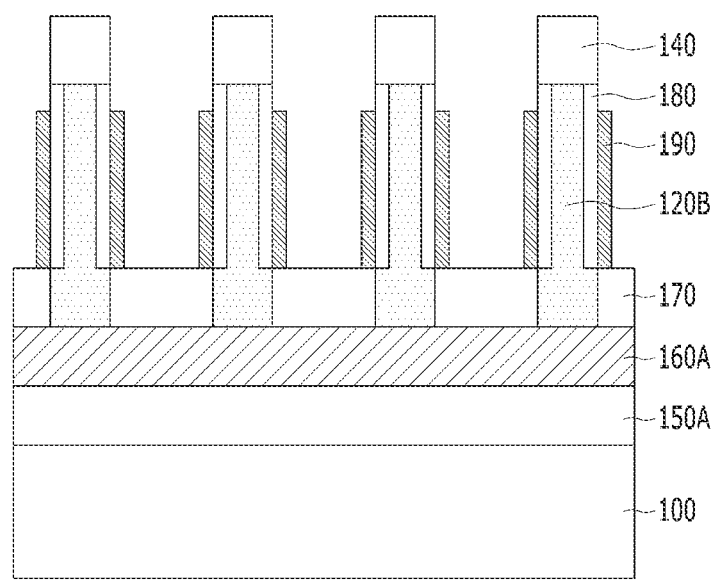
Figure 12A:
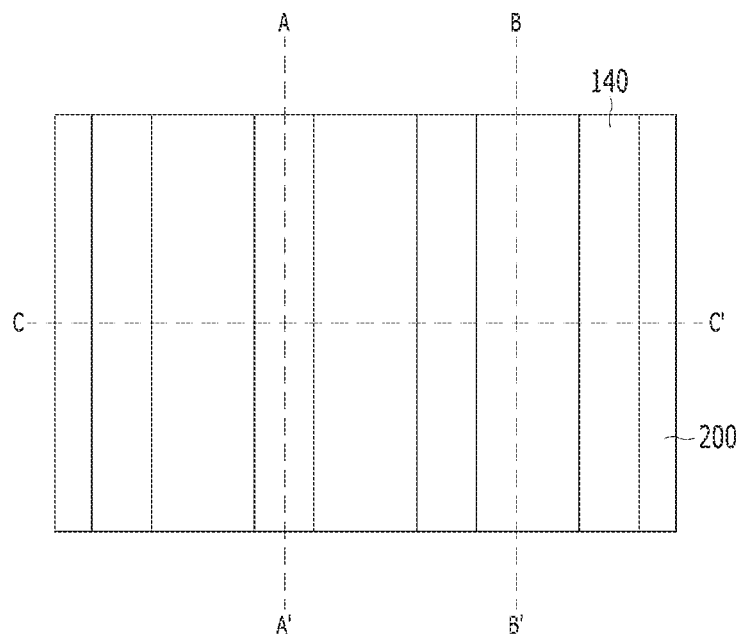
Figure 12B:
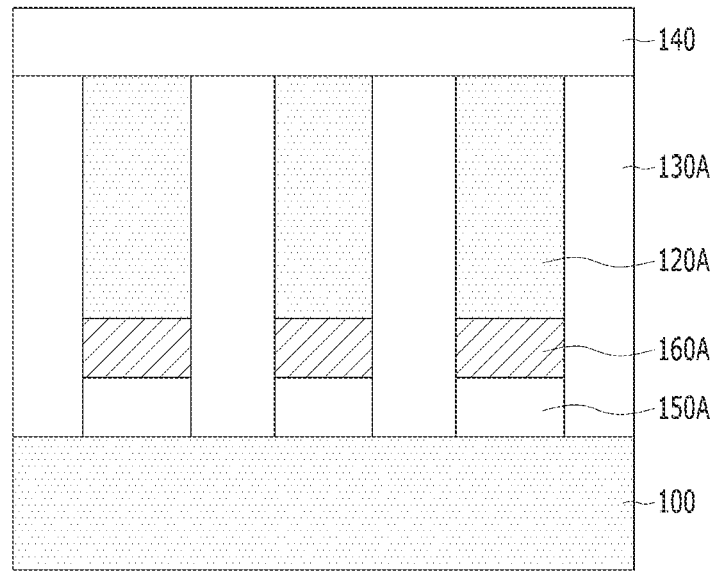
Figure 12C:
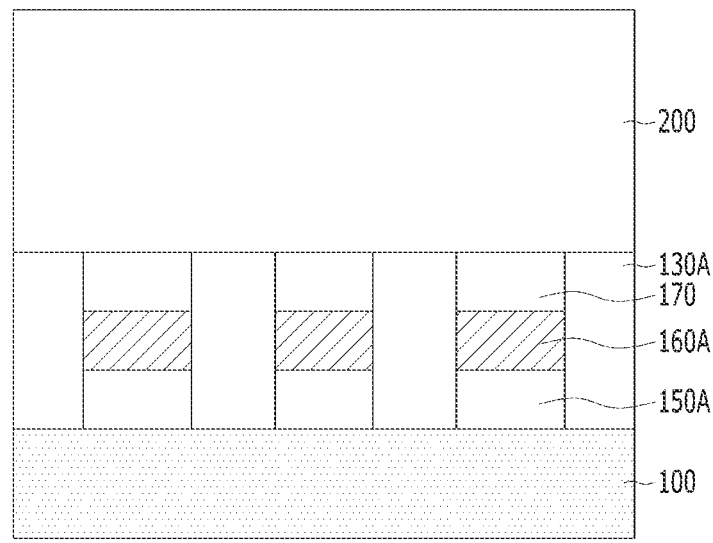
Figure 12D:
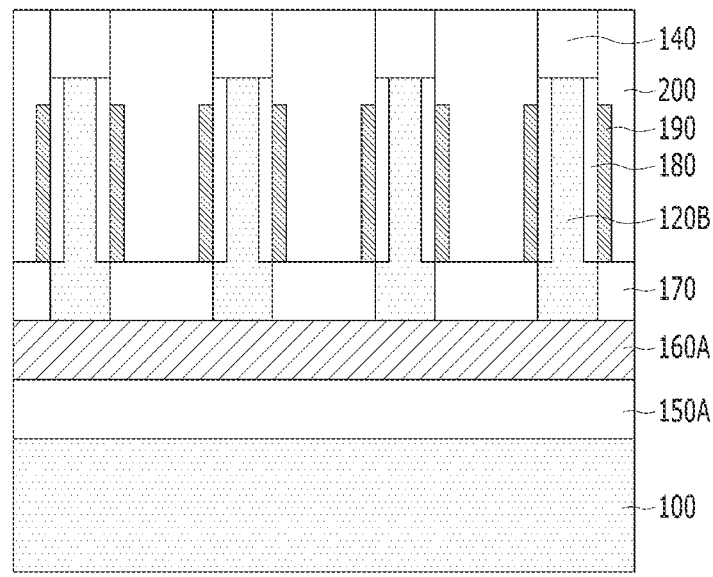

Referring to FIGS. 9A to 9D, an insulating material having a thickness sufficient to fill an empty space defined by the first insulating layer 130, the semiconductor pillar 120A, and the hard mask layer 140 may be formed over the structure of FIGS. 8A and 8B, and an etching process such as, for example, an etch-back process may be performed so that the insulating material remains over the first conductive line 160A to a predetermined thickness. Accordingly, a third insulating layer 170 may be formed to cover a portion of the first conductive line 160A, which is not covered by the hard mask layer 140.

Here, the third insulating layer 170 may include various insulating materials such as, for example, silicon oxide, silicon nitride, silicon oxynitride, or a combination thereof. The third insulating layer 170 may be used to electrically and physically separate the first conductive line 160A from a second conductive line (refer to 190 of FIGS. 11A to 11D) to be formed in a subsequent process. In order to provide a space in which the second conductive line is to be formed, the third insulating layer 170 may have a top surface that is lowered by a predetermined degree from the top surface of the semiconductor pillar 120A. Accordingly, a portion of the semiconductor pillar 120A may protrude upward from the third insulating layer 170. The portion of the semiconductor pillar 120A that protrudes above the third insulating layer 170 will be hereinafter referred to as a protruding portion of the semiconductor pillar 120A.

In an embodiment, where the third insulating layer 170 includes the same insulating material as the first insulating layer 130, a portion of the first insulating layer 130, which is not covered by the hard mask layer 140 and exposed, may be etched during the forming process of the third insulating layer 170, and thus, a first insulating layer pattern 130A may be formed. The first insulating layer pattern 130A may include a first portion positioned under the hard mask layer 140 and a second portion not covered by the hard mask layer 140. The first portion may have a top surface having the same or substantially the same height as the top surface of the semiconductor pillar 120A, and the second portion may have a top surface having the same or substantially the same height as a top surface of the third insulating layer 170.

Referring to FIGS. 10A to 10D, a gate insulating layer 180 may be formed along a surface of the protruding portion of the semiconductor pillar 120A.

In the present embodiment, the gate insulating layer 180 may be formed by oxidizing a portion from a side surface of the protruding portion of the semiconductor pillar 120A. In this case, a width of the protruding portion of the semiconductor pillar 120A may be reduced so that a semiconductor pillar pattern 120B is formed, and the gate insulating layer 180 may include an oxide of a material constituting the semiconductor pillar 120A, for example, silicon oxide. However, the present disclosure is not limited thereto, and the gate insulating layer 180 may be formed over the side surface of the protruding portion of the semiconductor pillar 120A by various deposition methods, and may include various insulating materials such as, for example, silicon oxide, silicon nitride, silicon oxynitride, or the like, or a high-k material such as aluminum oxide. When the gate insulating layer 180 is formed over the side surface of the semiconductor pillar 120A by a deposition method, the semiconductor pillar 120A may be maintained the same or substantially the same. For example, the width of the semiconductor pillar 120A after the gate insulating layer 180 is formed may be substantially the same as the width of the semiconductor pillar 120A before the gate insulating layer 180 is formed.

Referring to FIGS. 11A to 11D, a second conductive lines 190 extending in the first direction may be formed. Two second conductive lines 190 may be formed over both sidewalls of the gate insulating layer 180 in the second direction, respectively.

Each of the second conductive lines 190 may be formed by depositing a conductive material conformally along a lower profile over the structure of FIGS. 10A to 10D, and performing blanket etching. The blanket etching may be performed to expose the surface of the third insulating layer 170 so that the adjacent second conductive lines 190 in the second direction are separated from each other. For reference, in the structure of FIGS. 10A to 10D, the first insulating layer patterns 130A and the semiconductor pillar patterns 120B in which the gate insulating layer 180 is formed may be alternately arranged along the first direction, under the hard mask layer 140 extending in the first direction. Accordingly, the second conductive lines 190 may extend in the first direction to be formed over both sidewalls of the first insulating layer patterns 130A and the gate insulating layers 180 alternately arranged in the first direction.

The second conductive line 190 may include various conductive materials, for example, a metal such as platinum (Pt), tungsten (W), aluminum (Al), copper (Cu), tantalum (Ta), titanium (Ti), ruthenium (Ru), or molybdenum (Mo), a compound of this metal, or an alloy of these metals. The second conductive line 190 may function as a word line electrically connected to a gate terminal of a transistor.

Referring to FIGS. 12A to 12D, an insulating material covering the structure of FIGS. 11A to 11D may be formed, and a planarization process may be performed until the hard mask layer 140 is exposed. Accordingly, a fourth insulating layer 200 may be formed. The fourth insulating layer 200 may include various insulating materials such as, for example, silicon oxide, silicon nitride, silicon oxynitride, or a combination thereof. Furthermore, the fourth insulating layer 200 may include an insulating material having an etch rate different from that of the hard mask layer 140.

Figure 13A:
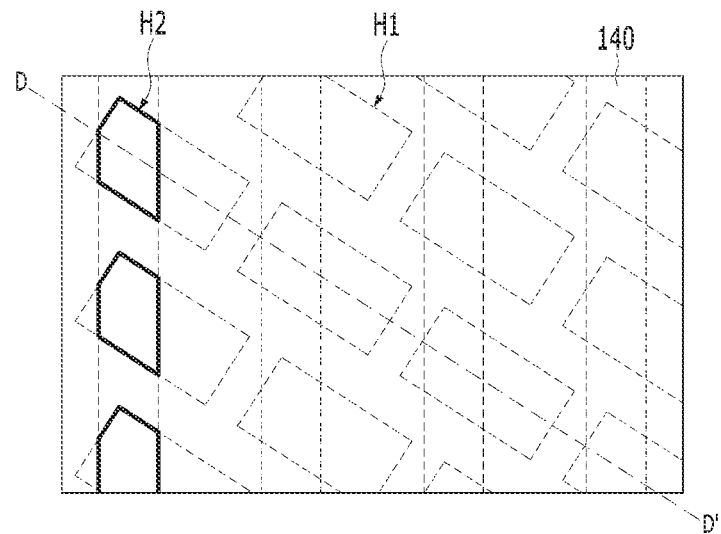
Figure 13B:
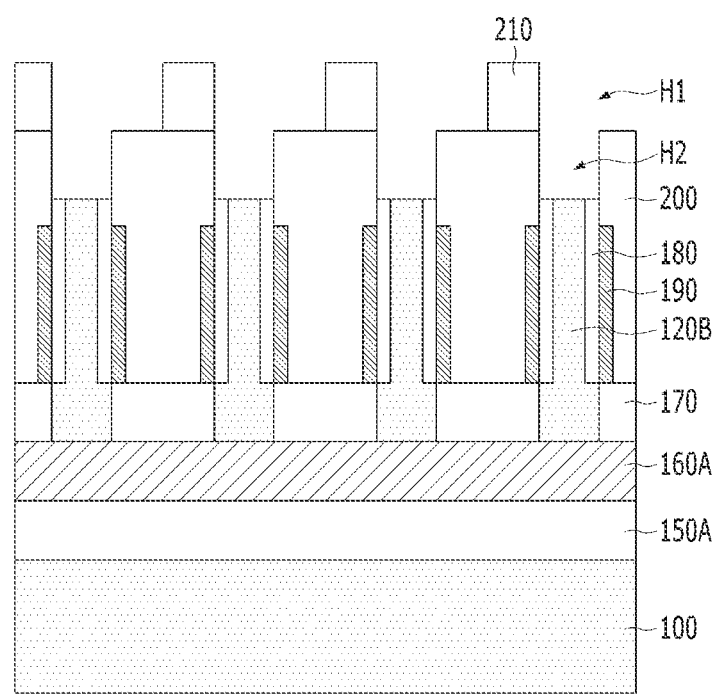

Referring to FIGS. 13A and 13B, a fifth insulating layer 210 may be formed over the hard mask layer 140 and the fourth insulating layer 200. The fifth insulating layer 210 may be selectively etched to form a first hole H1 exposing a portion of the first mask layer 140.

The fifth insulating layer 210 may include an insulating material having an etch rate different from that of the hard mask layer 140. As an example, the fifth insulating layer 210 may be formed of the same material as the fourth insulating layer 200. In a plan view, the first hole H1 may be disposed to overlap with each of the plurality of semiconductor pillar patterns 120B under the hard mask layer 140, and may have a larger planar area than the semiconductor pillar pattern 120B. Accordingly, the first hole H1 may partially overlap with the fourth insulating layer 200. This allows securing a space for forming a storage node as described later. However, in this case, since a sufficient distance must exist between the adjacent first holes H1, the first hole H1 may have a bar shape having a long side and a short side, or a shape similar thereto. For example, the first hole H1 may have a long side which is parallel to the line D-D'. A direction parallel to the line D-D', for example, a diagonal direction with respect to the first direction and the second direction, will be referred to as a third direction.

Next, by removing a portion of the hard mask layer 140 exposed by the first hole H1, a second hole H2 exposing the top surface of the semiconductor pillar pattern 120B may be formed in the hard mask layer 140. The second hole H2 partially overlaps with the first hole H1, and the first and second holes H1 and H2 are integrally connected to each other.

Figure 14A:
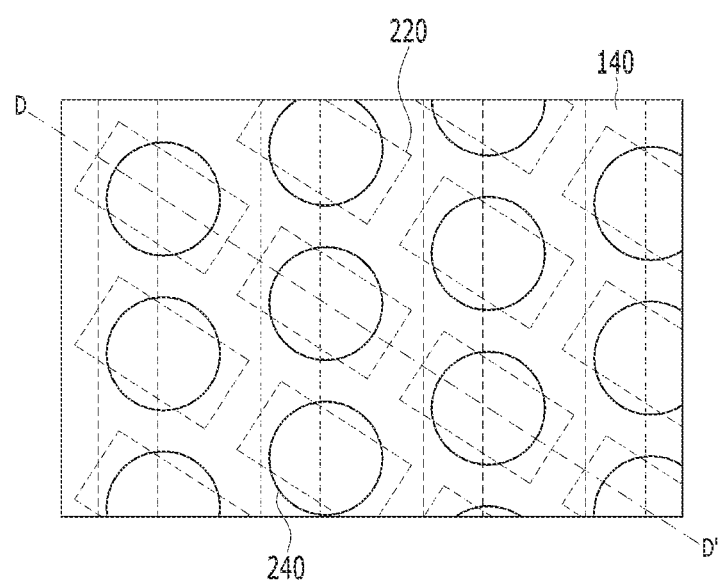
Figure 14B:
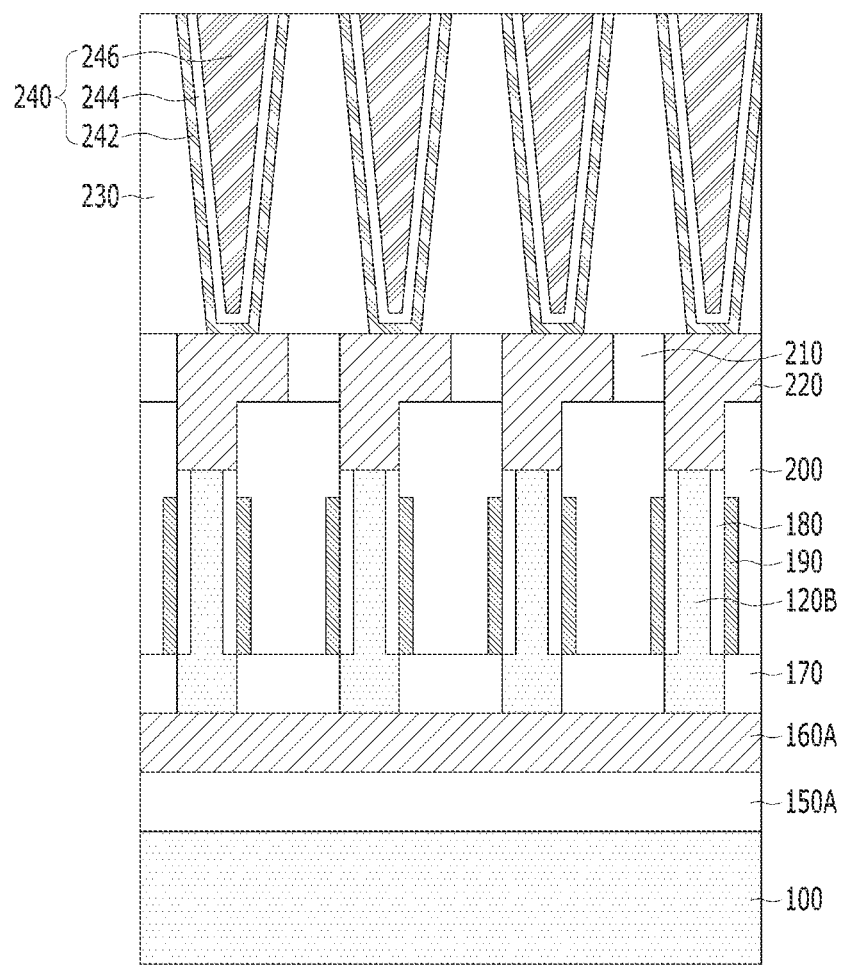

Referring to FIGS. 14A and 14B, a conductive pattern 220 may be formed by filling the first and second holes H1 and H2.

The conductive pattern 220 may be formed by first applying a conductive material having a thickness sufficiently to fill the first and second holes H1 and H2 over the structure of FIGS. 13A and 13B, and then performing a planarization process until the top surface of the fifth insulating layer 210 is exposed. The conductive pattern 220 may include various conductive materials, for example, a metal such as platinum (Pt), tungsten (W), aluminum (Al), copper (Cu), tantalum (Ta), titanium (Ti), ruthenium (Ru), or molybdenum (Mo), a compounds of this metal, or an alloy of these metals. The conductive pattern 220 may correspond to a storage node contact electrically connected to the other terminal of a transistor, for example, a source terminal.

Subsequently, a storage node 240 electrically connected to the conductive pattern 220 may be formed over the conductive pattern 220. Since the area of the top surface of the conductive pattern 220 is larger than the area of the top surface of the semiconductor pillar pattern 120B in a plan schematic diagram, the contact characteristics between the conductive pattern 220 and the storage node 240 may be improved.

The storage node 240 may include a capacitor with a dielectric layer 244 interposed between two electrodes 242 and 246. In the present embodiment, the storage node 240 may be formed by forming a sixth insulating layer 230 over the conductive pattern 220 and the fifth insulating layer 210, selectively etching the sixth insulating layer 230 to form a hole exposing the conductive pattern 220, depositing a conductive material along an inner wall of the hole to form a first electrode 242, forming the dielectric layer 244 over the first electrode 242 along its surface, and filling a remaining space of the hole where the first electrode 242 and the dielectric layer 244 are formed with a conductive material to form a second electrode 246. In this case, a cylindrical capacitor may be formed.

However, the present disclosure is not limited thereto, and the storage node 240 may include capacitors having various shapes. Alternatively, the storage node 240 may include various devices capable of storing data, instead of the capacitor. As an example, the storage node 240 may include a variable resistance element that stores different data by switching in different resistance states.

The semiconductor device of the present embodiment may be fabricated by the fabricating method described above.

The semiconductor device of the present embodiment may include the substrate 100, a stacked structure of the second insulating layer pattern 150A and the first conductive line 160A disposed over the substrate 100 and extending in the second direction, the semiconductor pillar patterns 120 disposed over the first conductive line 160A and arranged along the first and second directions, the second conductive line 190 formed over a portion of the semiconductor pillar pattern 120B with the gate insulating layer 180 interposed therebetween, in particular, the sidewall of the protruding portion of the semiconductor pillar 120B and extending in the first direction, and the storage node 240 formed over the semiconductor pillar pattern 120B and electrically connected to the semiconductor pillar pattern 120B through the conductive pattern 220.

The semiconductor pillar pattern 120B may function as a channel of a transistor, and may be controlled by the second conductive line 190 serving as a word line. A bottom end of the semiconductor pillar pattern 120B may function as a drain terminal of the transistor, and may be connected to the first conductive line 160A serving as a bit line. A top end of the semiconductor pillar pattern 120B may function as a source terminal of the transistor, and may be connected to the storage node 240. Accordingly, the semiconductor device including the transistor having the channel extending in a vertical direction, and the storage node 240, the word line, and the bit line which are connected to the transistor may be implemented.

A detailed description of each of the components of the semiconductor device of the present embodiment has already been described in the process of describing the above-described fabricating method, and thus, the detailed description will be omitted.

According to the semiconductor device and the fabricating method thereof in the present embodiment, the following advantages may be obtained.

First, since the semiconductor pillar pattern 120B used as the channel of the transistor extends in the vertical direction and the first conductive line 160A used as the bit line is filled thereunder, the area of the semiconductor device may be reduced.

In addition, since the semiconductor pillar pattern 120B is formed independently from the substrate 100 by the first conductive line 160A, it may be facilitated to form the semiconductor pillar pattern 120B having a desired characteristic. The semiconductor pillar pattern 120B and the substrate 100 may have different semiconductor materials and/or crystal structures. As an example, the semiconductor pillar pattern 120B may include a single crystal semiconductor, for example, single crystal silicon, which has an excellent characteristic, for example, improved current transfer capability.

In addition, by interposing the second insulating layer pattern 150A between the first conductive line 160A and the substrate 100, mutual interference such as leakage occurring between the first conductive lines 160A through the substrate 100 may be prevented or reduced.

As a result, the degree of integration and operating characteristics of the semiconductor device may be improved.

Meanwhile, the bottom and top ends of the aforementioned semiconductor pillar pattern 120B may function as the drain terminal and the source terminal, respectively. To this end, it may be necessary to form a junction region by doping with impurities at each of the bottom and top ends of the semiconductor pillar pattern 120B. Since the top end of the semiconductor pillar pattern 120B is exposed through the first and second holes H1 and H2 formed by the process of FIGS. 13A and 13B, impurities may be doped by ion implantation toward the top end of the exposed semiconductor pillar pattern 120B before filling the first and second holes H1 and H2 with the conductive pattern 220. Thus, forming of the junction region may be facilitated at the top end of the semiconductor pillar pattern 120B. A method of forming the junction region at the bottom end of the semiconductor pillar pattern 120B will be described by way of example with reference to FIGS. 15A to 15C below.

Figure 15A:
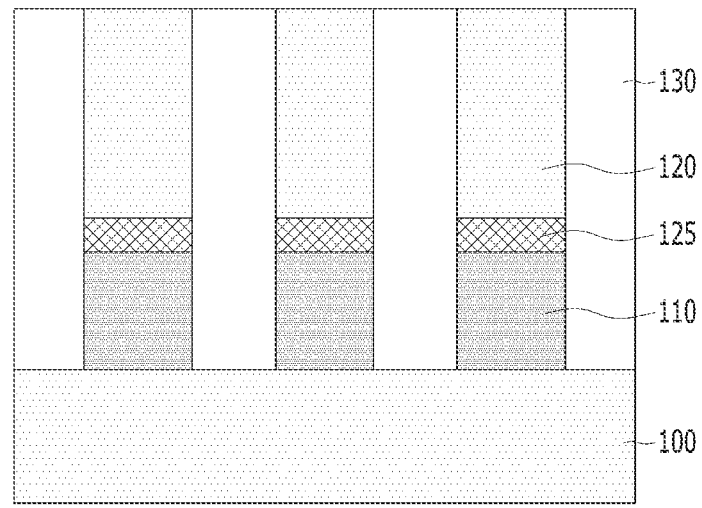
FIG. 15A is a schematic diagram illustrating an example of a method of forming a junction region at a bottom end of a semiconductor pillar pattern.
Figure 15B:
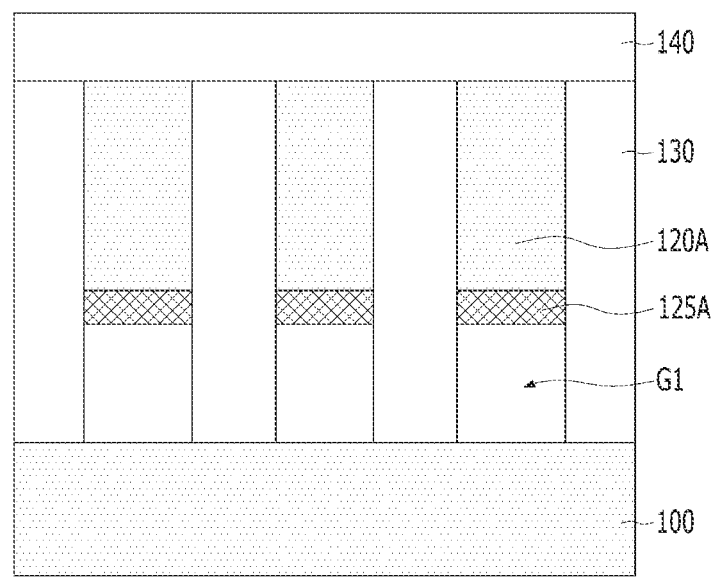
FIG. 15B is a schematic diagram illustrating another example of a method of forming a junction region at a bottom end of a semiconductor pillar pattern.
Figure 15C:
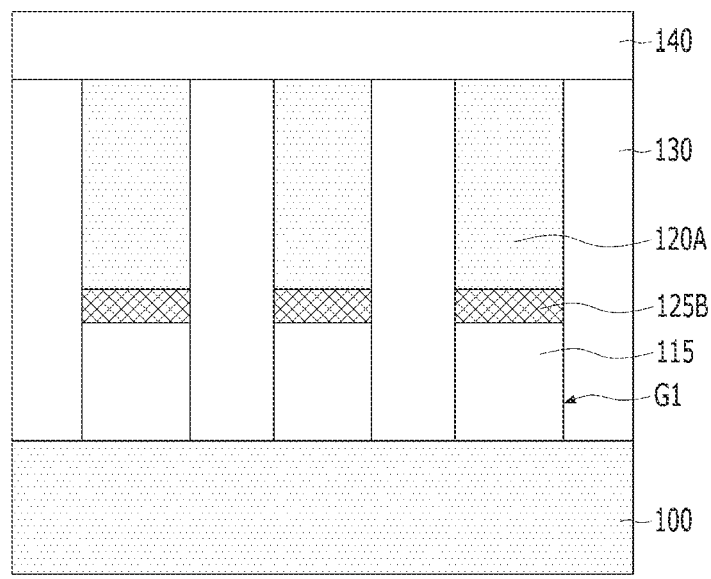
FIG. 15C is a schematic diagram illustrating still another example of a method of forming a junction region at a bottom end of a semiconductor pillar pattern.

FIG. 15A is a schematic diagram illustrating an example of a method of forming a junction region at a bottom end of a semiconductor pillar pattern, FIG. 15B is a schematic diagram illustrating another example of a method of forming a junction region at a bottom end of a semiconductor pillar pattern, and FIG. 15C is a schematic diagram illustrating still another example of a method of forming a junction region at a bottom end of a semiconductor pillar pattern.

Referring to FIG. 15A, the sacrificial layer 110 may be formed of a material doped with impurities, for example, SiGe doped with impurities.

In this case, the impurities of the sacrificial layer 110 may diffuse to the bottom end of the semiconductor layer 120 to be transformed into a semiconductor pillar pattern to form a junction region 125.

Alternatively, referring to FIG. 15B, an isotropic doping process, for example, an isotropic plasma doping process, may be performed in a state in which the first groove G1 is formed.

In this case, impurities may be doped into the bottom end of the semiconductor pillar 120A exposed by the first groove G1 to form a junction region 125A.

Alternatively, referring to FIG. 15C, a layer 115 doped with impurities, for example, a glass layer doped with impurities, may be formed in a state in which the first groove G1 is formed, and the impurities of the layer 115 may diffuse to the bottom end of the semiconductor pillar 120A by a heat treatment to form a junction region 125B.

Figure 5A:
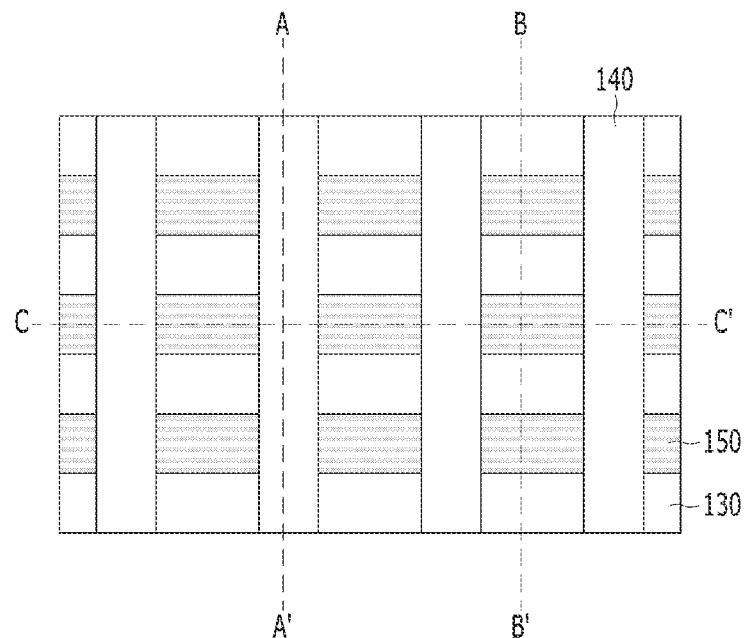
Figure 5B:
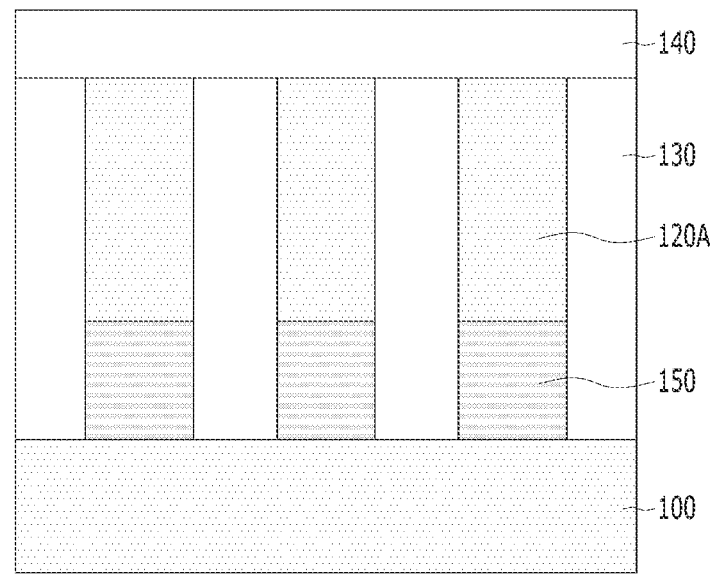
Figure 5C:
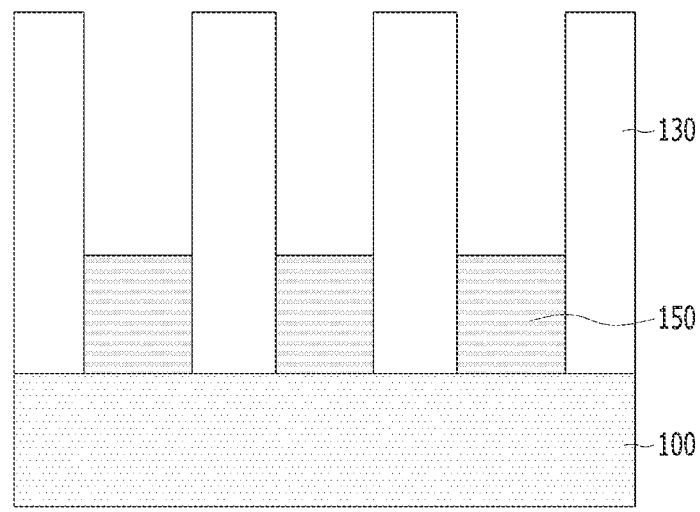
Figure 5D:
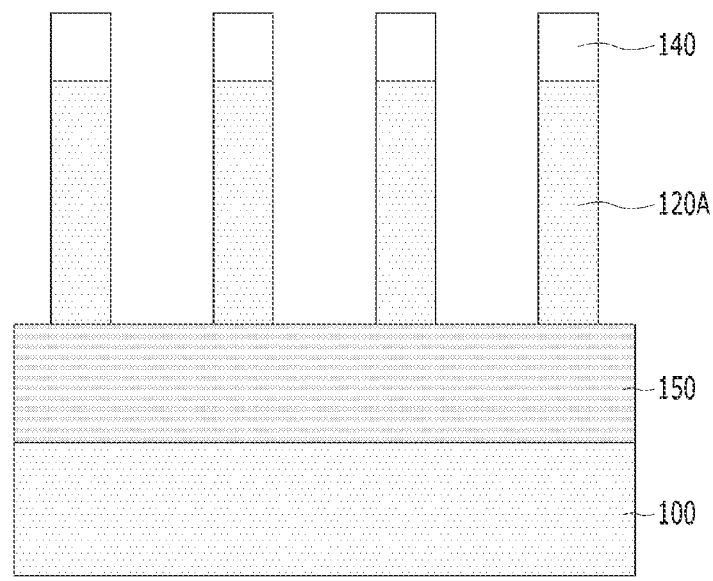
Figure 6A:
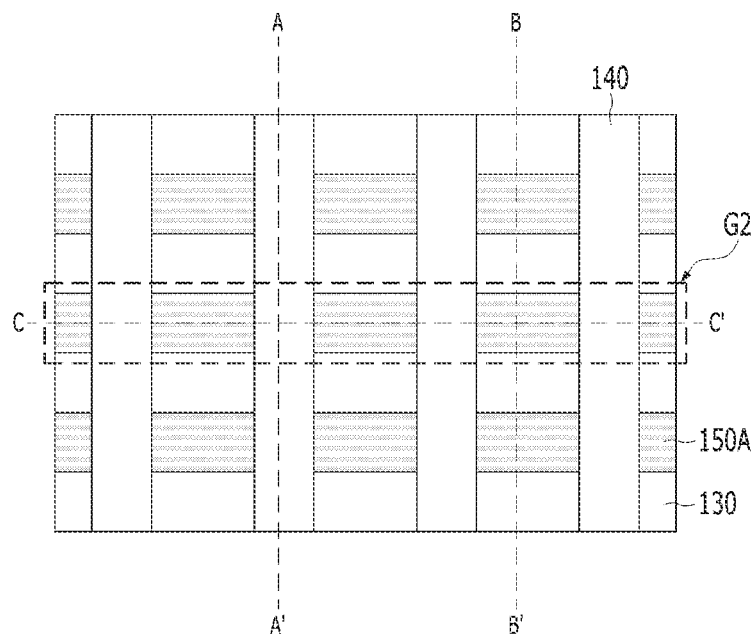
Figure 6B:
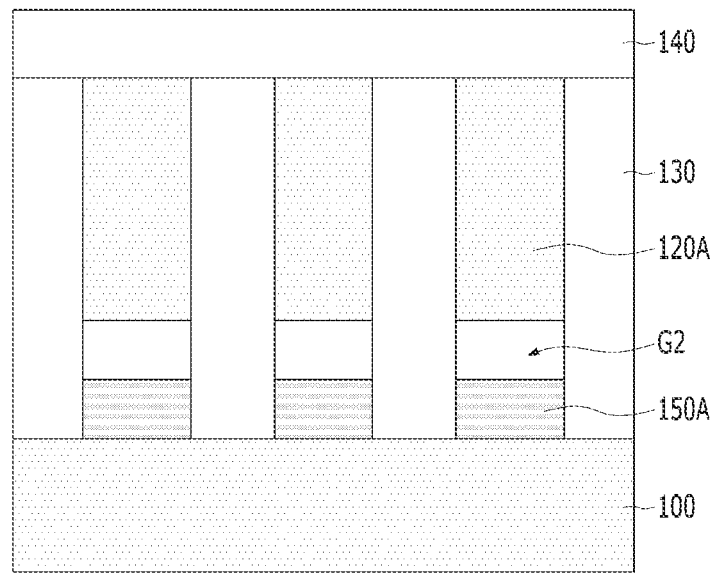
Figure 6C:
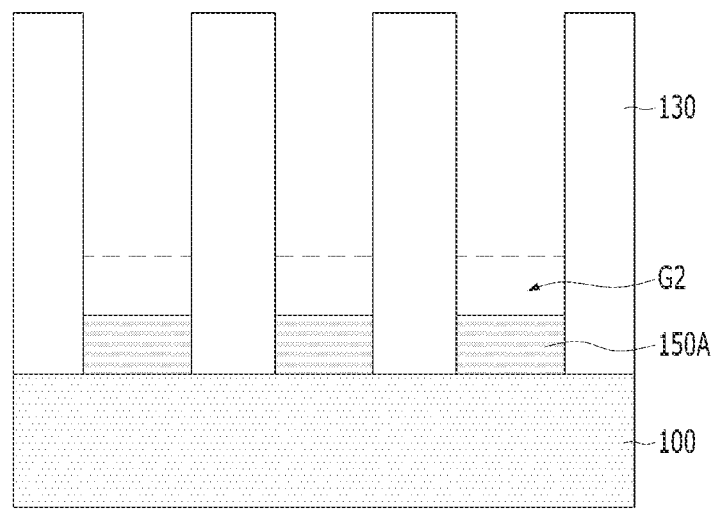
Figure 6D:
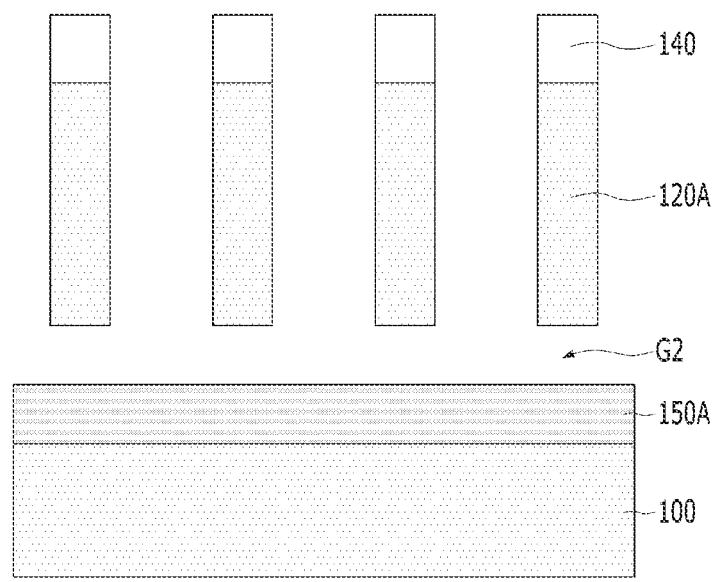
Figure 7A:
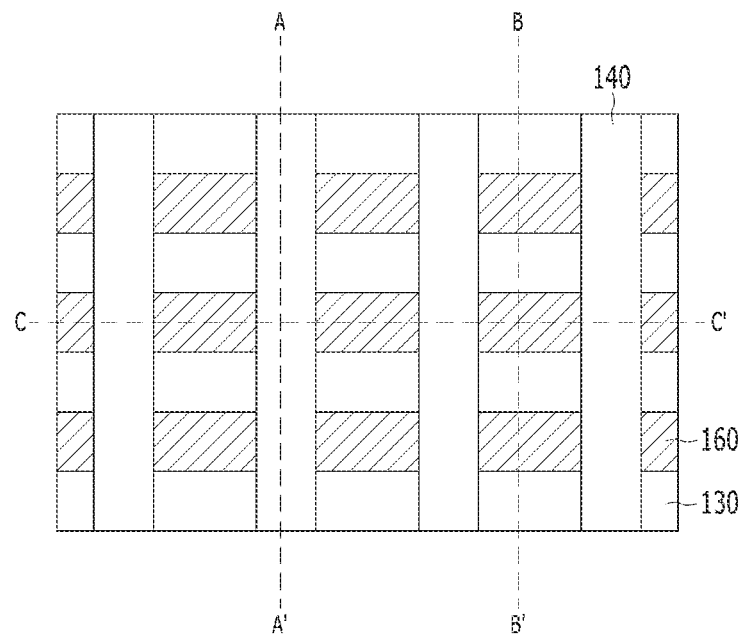
Figure 7B:
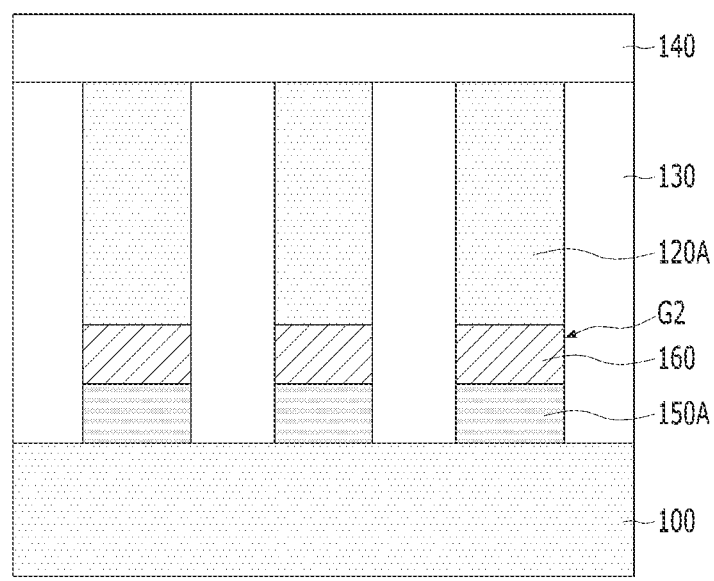
Figure 7C:
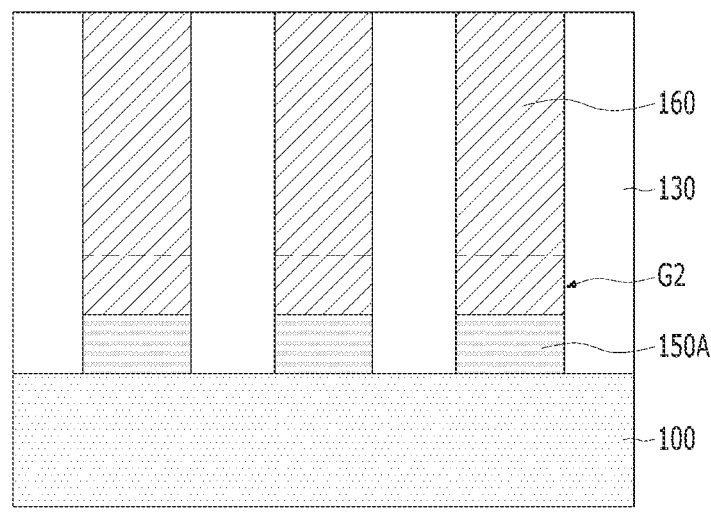
Figure 7D:
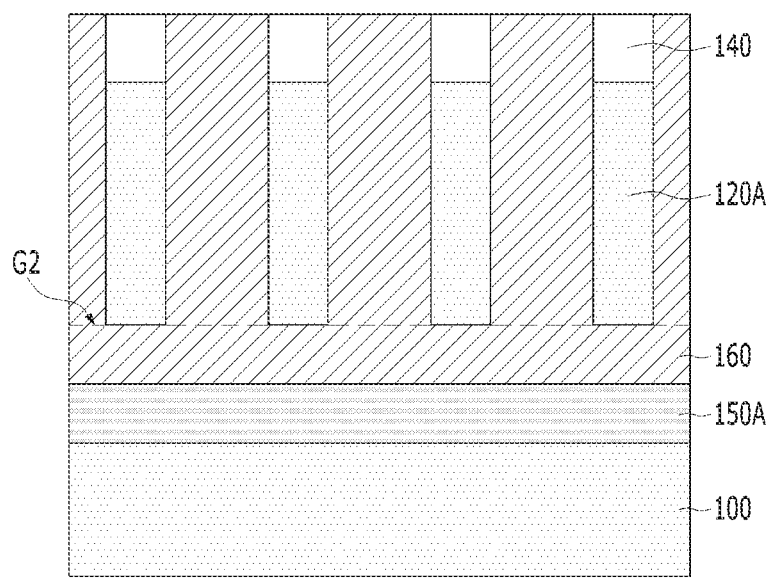

After forming the junction region 125B, the layer 115 may be removed, and subsequent processes, such as the processes of FIGS. 5A and 5B and subsequent processes thereof, may be performed.

In the embodiments of FIGS. 15B and 15C, the junction regions 125A and 125B may be formed after the first groove G1 is formed, but the present disclosure is not limited thereto. In another embodiment, after the second groove G2 is formed (see FIGS. 6A and 6B), a junction region may be formed in the same manner.

In addition, a silicide layer may be formed to reduce contact resistance between the above-described semiconductor pillar pattern 120B and the first conductive line 160A and/or between the semiconductor pillar pattern 120B and the conductive pattern 220. Since the top end of the semiconductor pillar pattern 120B is exposed through the first and second holes H1 and H2 formed by the process of FIGS. 13A and 13B, a silicide layer may be formed over the semiconductor pillar pattern 120B by depositing a metal material over the top surface of the semiconductor pillar pattern 120B and performing a silicide process. A method of forming a silicide layer under the semiconductor pillar pattern 120B will be described by way of example with reference to FIGS. 16A and 16B below.

Figure 16A:
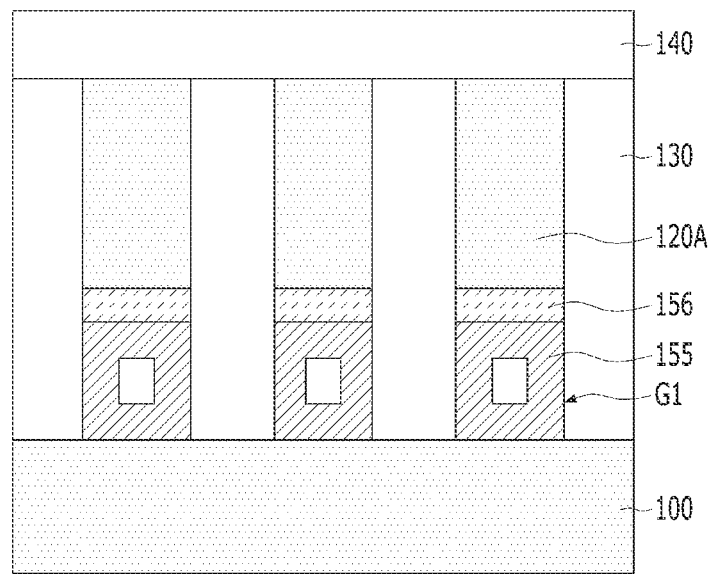
FIGS. 16A and 16B are schematic diagrams illustrating an example of a method of forming a silicide layer under a semiconductor pillar pattern.
Figure 16B:
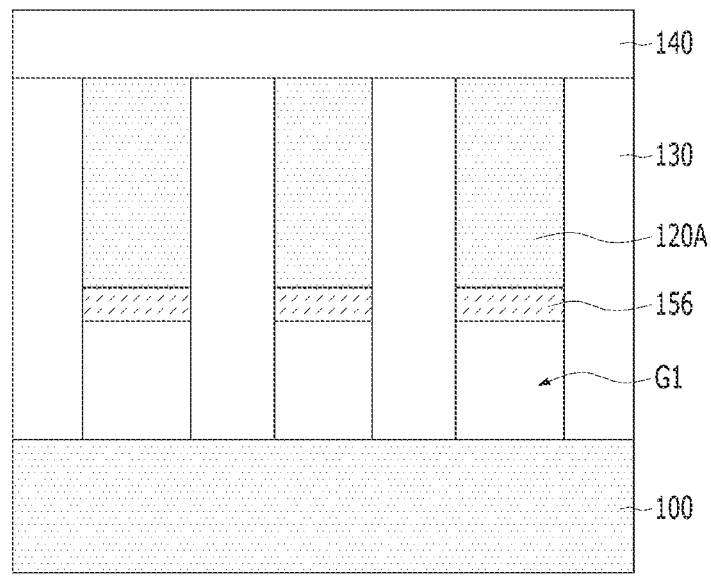

FIGS. 16A and 16B are schematic diagrams illustrating an example of a method of forming a silicide layer under a semiconductor pillar pattern.

Referring to FIG. 16A, in a state in which the first groove G1 is formed, a metal material 155 may be formed along the surface of the first groove G1. The metal material 155 may be formed by an ALD (atomic layer deposition) method or the like, and may be formed to a thickness that does not completely fill the first groove G1.

Subsequently, when a heat treatment is performed, the metal material 155 may react with the semiconductor material of the semiconductor pillar 120A to form the silicide layer 156.

Referring to FIG. 16B, the metal material 155, which has not been reacted, may be removed, and subsequent processes, for example, the process of FIGS. 5A and 5B and subsequent processes thereof, may be performed.

In the present embodiment, the silicide layer 156 may be formed after the formation of the first groove G1, but the present disclosure is not limited thereto. In another embodiment, a silicide layer may be formed after the second groove G2 is formed (refer to FIGS. 6A and 6B).

Although the above embodiments have described the cell region in which the transistor and the storage node 240 connected thereto are arranged, the semiconductor device may further include a peripheral circuit region for driving the cell region or performing other functions. This peripheral circuit region may be formed together with the cell region. This will be described with reference to FIGS. 17A to 17F.

FIGS. 17A to 17F are schematic diagrams illustrating a semiconductor device according to another embodiment of the present disclosure, and a method for fabricating the same. FIGS. 17A to 17F are cross-sectional schematic diagrams taken along the aforementioned line C-C'. Parts substantially identical to those of the above-described embodiments are denoted by the same reference numerals.

Figure 17A:
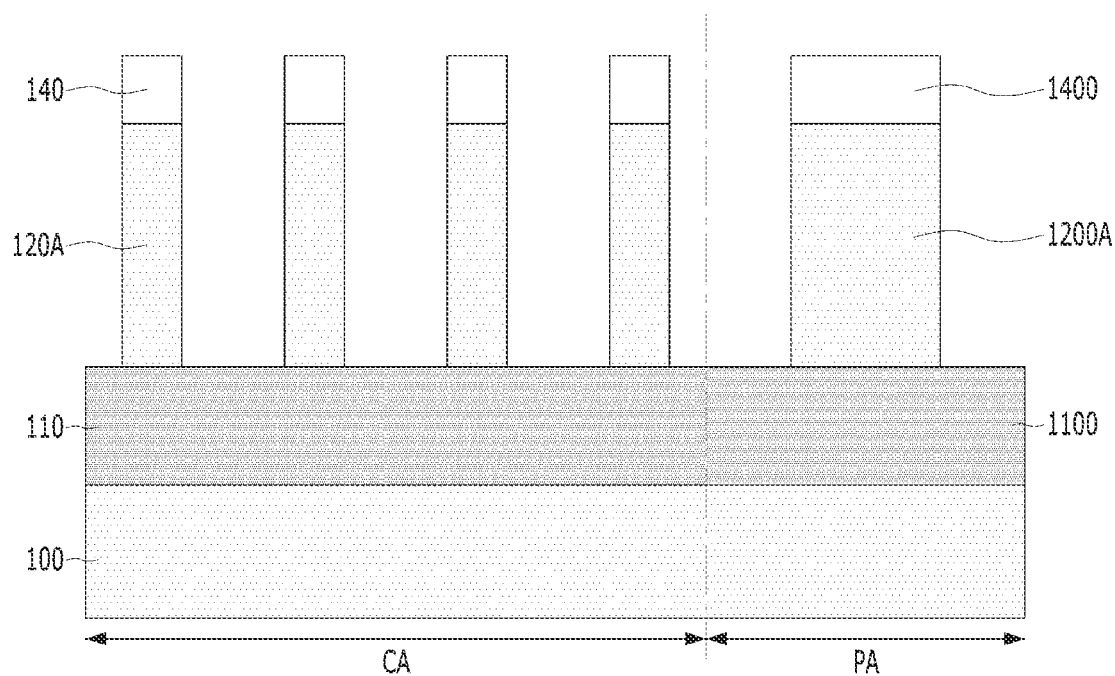
FIGS. 17A to 17F are schematic diagrams illustrating a semiconductor device according to another embodiment of the present disclosure, and a method for fabricating the same.

Referring to FIG. 17A, after providing a substrate 100 having a cell region CA and a peripheral circuit region PA, the above-described processes of FIGS. 1A to 3D may be performed to provide a stacked structure of a sacrificial layer 110, a semiconductor pillar 120A, and a hard mask layer 140 over the substrate 100 in the cell region CA. At this time, substantially the same processes may be performed in the peripheral circuit region PA, so that a peripheral sacrificial layer 1100, a peripheral semiconductor layer 1200A, and a peripheral hard mask layer 1400 may be formed over the substrate 100 in the peripheral circuit region PA. Accordingly, the peripheral sacrificial layer 1100, the peripheral semiconductor layer 1200A, and the peripheral hard mask layer 1400 may be positioned in the same level in the vertical direction and be formed of the same material as the sacrificial layer 110, the semiconductor pillar 120A, and the hard mask layer 140, respectively. However, the arrangement or shape of the peripheral sacrificial layer 1100, the peripheral semiconductor layer 1200A, and the peripheral hard mask layer 1400 in a plan view, may be variously modified depending on the configuration of a device/circuit to be formed in the peripheral circuit region PA.

Figure 17B:
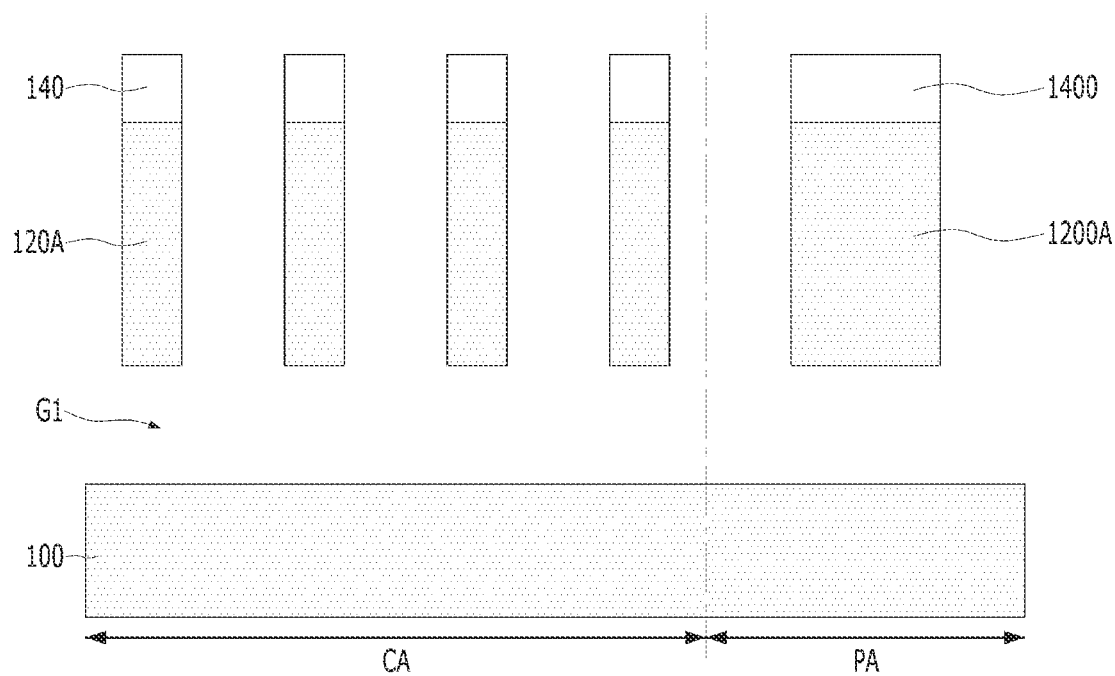

Referring to FIG. 17B, in the process of FIGS. 4A to 4D, for example, in the process of removing the sacrificial layer 110 of the cell region CA to form the first groove G1, the peripheral sacrificial layer 1100 may also be removed.

Figure 17C:
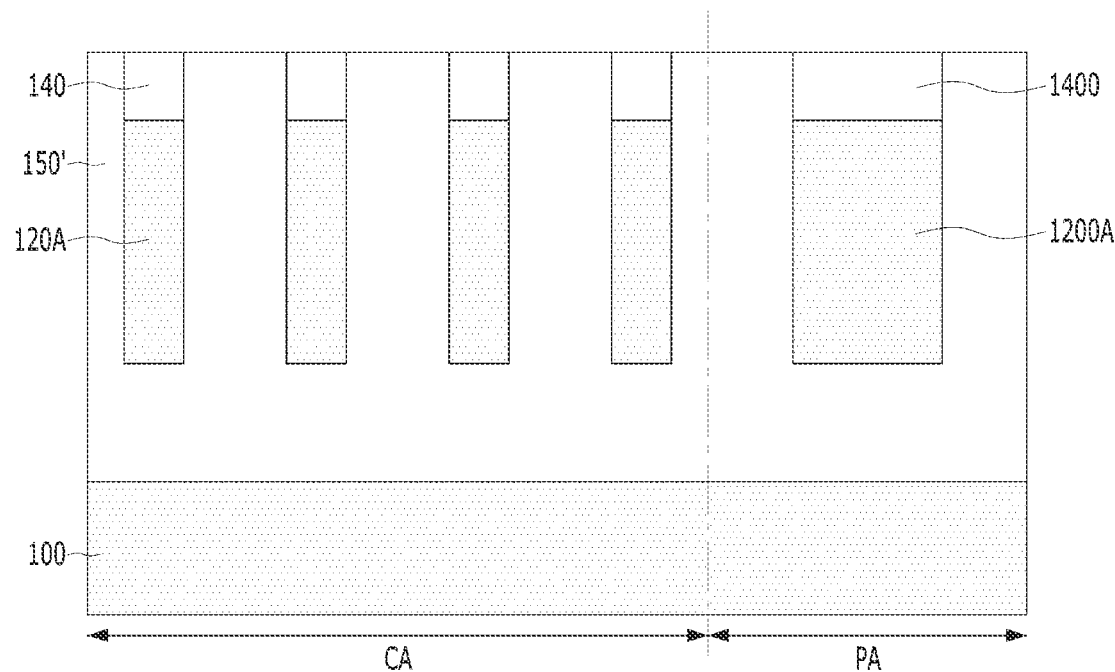

Referring to FIG. 17C, an initial second insulating layer 150' may be formed over the substrate 100 of the cell region CA and the peripheral circuit region PA to fill the first groove G1 and a space formed by the removal of the peripheral sacrificial layer 1100 while filling an empty space thereover.

The initial second insulating layer 150 may be formed by depositing an insulating material over the structure of FIG. 17B, and performing a planarization process until the surfaces of the hard mask layer 140 and the peripheral hard mask layer 1400 are exposed. For reference, when a portion of the initial second insulating layer 150' in the cell region CA is removed by a subsequent process, it may be transformed into the second insulating layer 150 illustrated in FIGS. 5A to 5D.

Figure 17D:
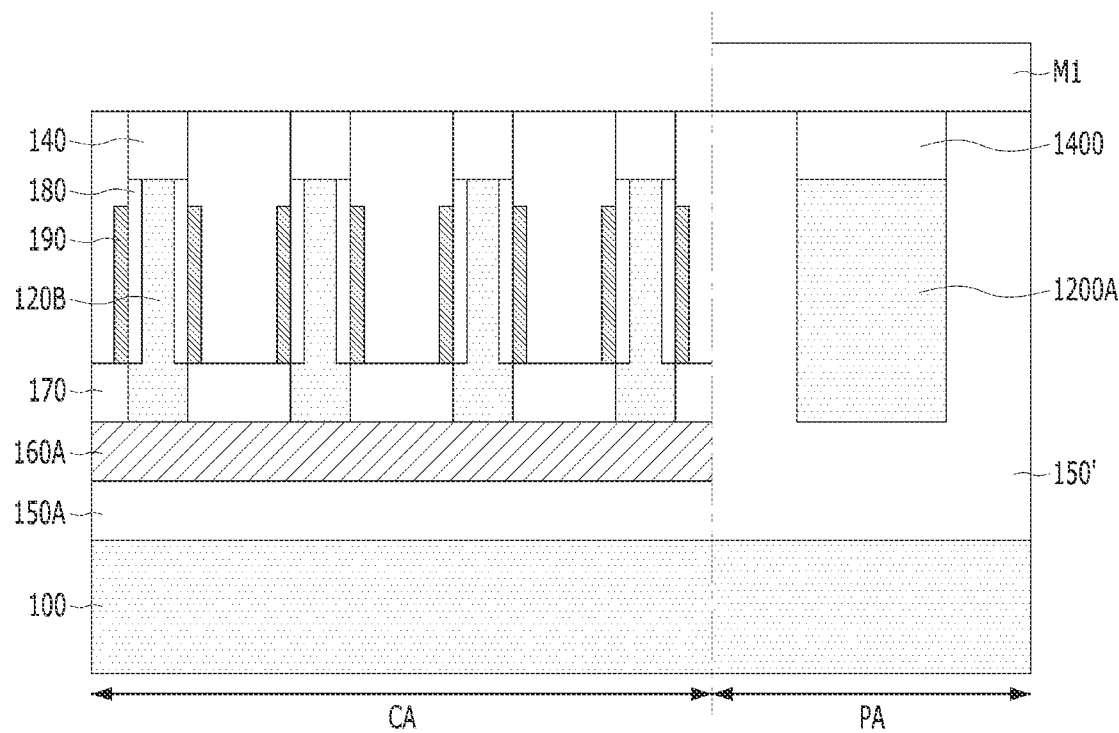

Referring to FIG. 17D, a first mask pattern M1 covering the peripheral circuit region PA and exposing the cell region CA may be formed over the structure of FIG. 17C, and aforementioned processes described with reference to FIGS. 5A to 12D may be performed. Accordingly, the same structure as the structure shown in FIGS. 12A to 12D may be secured in the cell region CA.

Since the peripheral circuit region PA is in a covered state, the state of FIG. 17C may be maintained.

Figure 17E:
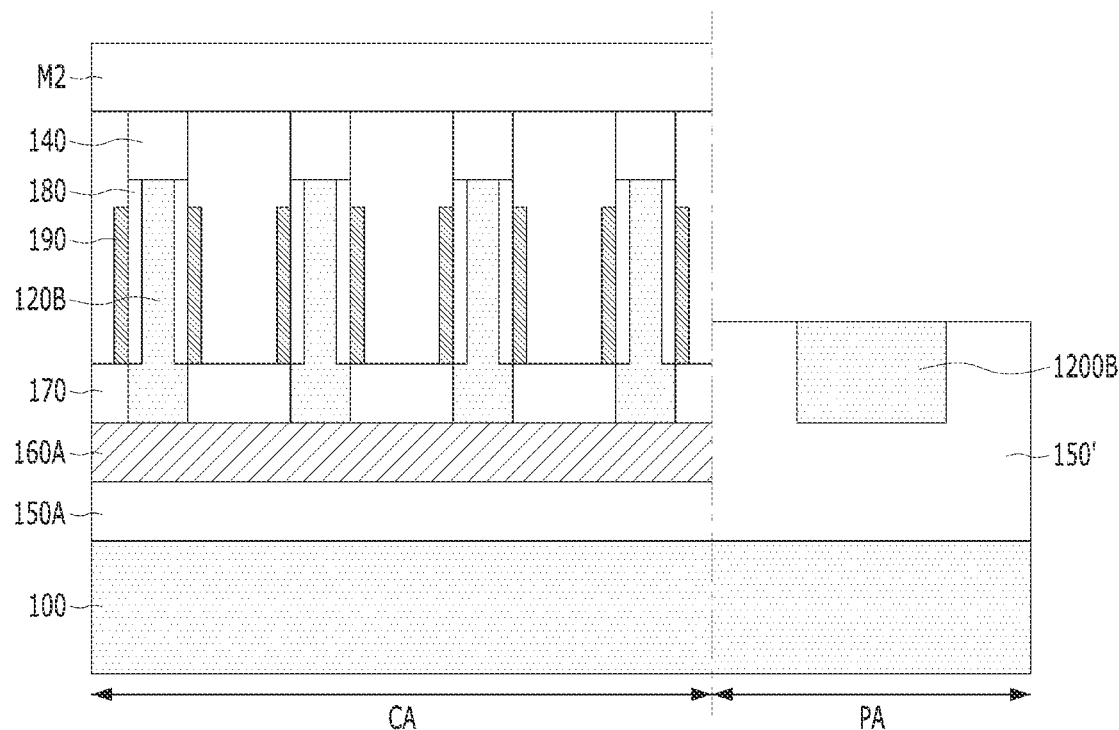

Referring to FIG. 17E, a second mask pattern M2 may be formed over the structure of FIG. 17D. The second mask pattern M2 may cover the cell region CA and may leave the peripheral circuit region PA uncovered or exposed. Then, a planarization process may be performed so that the peripheral semiconductor layer 1200A of FIG. 17D is exposed. The planarization process may be performed until the peripheral semiconductor layer 1200A has a desired thickness on the premise that the peripheral hard mask layer 1400 is removed. The planarized peripheral semiconductor layer 1200A will be referred to as a peripheral semiconductor layer pattern 1200B.

The thickness of the peripheral semiconductor layer pattern 1200B may be less than or equal to the thickness of the peripheral semiconductor layer 1200A. The planarization process may include a thinning process for making the thickness of the peripheral semiconductor layer pattern 1200B to be, for example, less than 10 nm. In the vertical direction, the bottom surface of the peripheral semiconductor layer pattern 1200B may be positioned at the same or substantially the same level as the bottom surface of the semiconductor pillar pattern 120B, and the top surface of the peripheral semiconductor layer pattern 1200B may be positioned at the same or substantially the same level as the top surface of the semiconductor pillar pattern 120B or at a lower level than the top surface of the semiconductor pillar pattern 120B. The peripheral semiconductor layer pattern 1200B may function as an active region of the peripheral circuit region PA.

During the planarization process on the peripheral semiconductor layer 1200A, the initial second insulating layer 150' may also be planarized to have the same or substantially the same top surface height as the peripheral semiconductor layer 1200A. The initial second insulating layer 150' may surround side and bottom surfaces of the peripheral semiconductor layer pattern 1200B. The initial second insulating layer 150' may have a bottom surface height substantially equal to that of the second insulating layer pattern 150A and a higher top surface height than that of the second insulating layer pattern 150A.

Figure 17F:
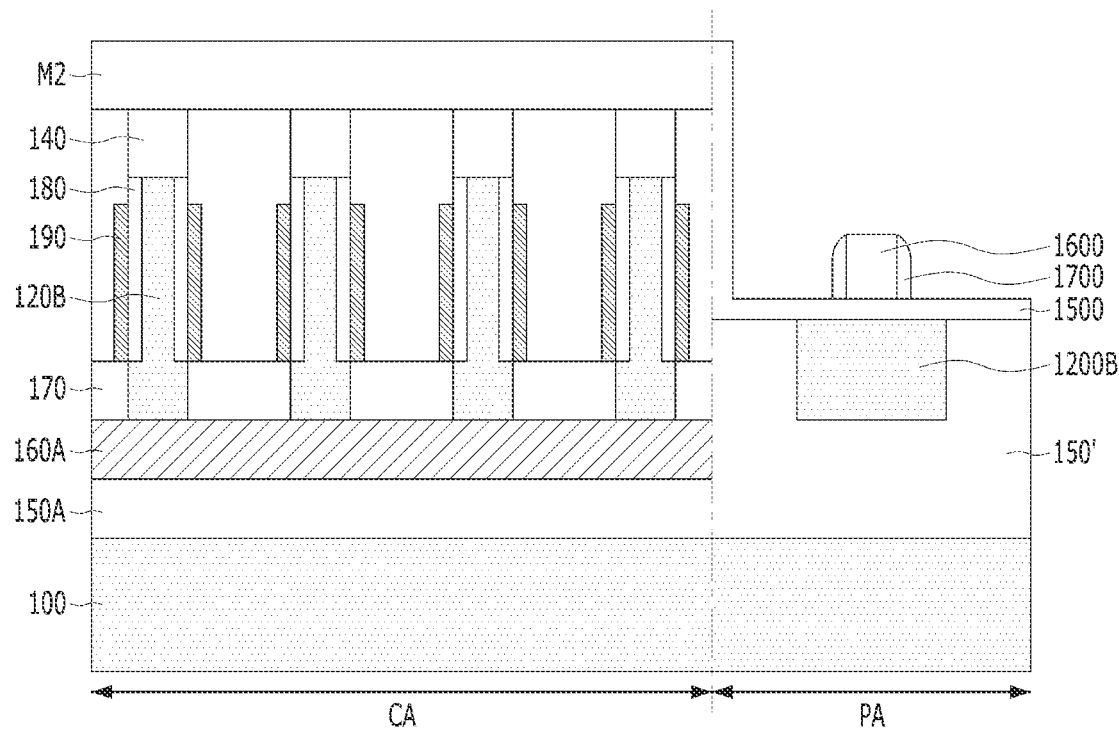

Referring to FIG. 17F, a desired device may be formed using the peripheral semiconductor layer pattern 1200B. In the present embodiment, a case in which a flat transistor is formed in the peripheral circuit region PA is illustrated. As an example, a peripheral circuit gate insulating layer 1500 may be formed along the bottom profile on the structure of FIG. 17E, and a peripheral circuit gate pattern 1600 and a peripheral circuit gate spacer 1700 may be formed thereover.

According to the present embodiment, since the peripheral semiconductor layer pattern 1200B functioning as an active region of the peripheral circuit region PA is physically and electrically separated from the substrate 100 by the initial second insulating layer 150, it may be possible to form a fully depleted silicon on insulator (SOI) transistor. In this case, it may be advantageous in terms of variation in operating characteristics of the transistor and reduction in leakage. When the thickness of the peripheral semiconductor layer pattern 1200B is, for example, less than 10 nm, the fully depletion characteristic may be further improved.

The above-described embodiments may be applicable to any semiconductor device including an NMOS transistor, a PMOS transistor, or a CMOS transistor, and a method for fabricating the same. The above-described embodiments may be applicable to various semiconductor devices, for example, non-volatile memory such as flash memory, resistive random-access memory (RRAM), phase-change random-access memory (PRAM), or magneto resistive random-access memory (MRAM), volatile memory such as dynamic random-access memory (DRAM) or static random-access memory (SRAM), non-memory such as a logic circuit, a CMOS image sensor (CIS), or the like.

According to the above embodiments of the present disclosure, it may be possible to provide a semiconductor device capable of increasing the degree of integration and improving operating characteristics, and a method for fabricating the same.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
    a substrate;
    a plurality of semiconductor pillars disposed over the substrate and arranged in a first direction and a second direction crossing the first direction;
    an insulating layer pattern disposed between the substrate and the semiconductor pillars and extending in the second direction;
    a first conductive line disposed between the insulating layer pattern and the semiconductor pillars and extending in the second direction;
    a second conductive line formed over sidewalls of the semiconductor pillars and extending in the first direction; and
    a storage node disposed over each of the semiconductor pillars.

2. The semiconductor device according to claim 1, wherein the first conductive line is physically and electrically separated from the substrate by the insulating layer pattern.

3. The semiconductor device according to claim 1, wherein both sidewalls of the first conductive line are aligned with both sidewalls of the insulating layer pattern in the first direction.

4. The semiconductor device according to claim 1, wherein the semiconductor pillars have a different material or a different crystal structure from that of the substrate.

5. The semiconductor device according to claim 1, further comprising:
    a conductive pattern interposed between each of the semiconductor pillars and the storage node,
    wherein an area of a top surface of the conductive pattern is larger than an area of a top surface of each of the semiconductor pillars in a plan schematic diagram.

6. The semiconductor device according to claim 1, further comprising:
    a junction region formed at a bottom end of each of the semiconductor pillars, which is in contact with the first conductive line.

7. The semiconductor device according to claim 1, further comprising:
    a silicide layer formed at a bottom end of each of the semiconductor pillars, which is in contact with the first conductive line.

8. The semiconductor device according to claim 1, wherein the substrate includes a cell region and a peripheral circuit region, and
    the semiconductor pillars, the insulating layer pattern, the first conductive line, the second conductive line, and the storage node are disposed in the cell region, and
    the semiconductor device further comprising:
    a peripheral semiconductor layer pattern disposed in the peripheral circuit region over the substrate; and
    an insulating layer disposed in the peripheral circuit region over the substrate and surrounding side and lower surfaces of the peripheral semiconductor layer pattern.

9. The semiconductor device according to claim 8, wherein the bottom surface of the peripheral semiconductor layer pattern is located at the same height as a bottom surface of each of the semiconductor pillars, and
    a top surface of the peripheral semiconductor layer pattern is located at a height equal to or lower than a top surface of each of the semiconductor pillars.

10. The semiconductor device according to claim 8, wherein the semiconductor pillars and the peripheral semiconductor layer pattern are formed of the same material.

11. The semiconductor device according to claim 8, wherein the peripheral semiconductor layer pattern is physically and electrically separated from the substrate by the insulating layer.

12. The semiconductor device according to claim 8, wherein a bottom surface of the insulating layer is located at the same height as a bottom surface of the insulating layer pattern, and
    a top surface of the insulating layer is located at a height higher than a top surface of the insulating layer pattern.

13. The semiconductor device according to claim 8, wherein the insulating layer and the insulating layer pattern are formed of the same material.

14. The semiconductor device according to claim 8, further comprising:
    a peripheral circuit gate insulating layer formed over the peripheral semiconductor layer pattern; and
    a peripheral circuit gate pattern formed over the peripheral circuit gate insulating layer.

* * * * *